(12) United States Patent
Hayden

(10) Patent No.: US 7,908,107 B2
(45) Date of Patent: Mar. 15, 2011

(54) LINE-REFLECT-REFLECT MATCH CALIBRATION

(75) Inventor: Leonard Hayden, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 11/879,865

(22) Filed: Jul. 18, 2007

(65) Prior Publication Data

US 2008/0018343 A1 Jan. 24, 2008

Related U.S. Application Data

(63) Continuation-in-part of application No. 11/449,979, filed on Jun. 9, 2006, now abandoned.

(60) Provisional application No. 60/831,940, filed on Jul. 18, 2006, provisional application No. 60/690,460, filed on Jun. 13, 2005, provisional application No. 60/689,597, filed on Jun. 11, 2005.

(51) Int. Cl.
*G01R 35/00* (2006.01)

(52) U.S. Cl. ............... 702/107; 702/106; 324/601

(58) Field of Classification Search .......... 702/105–107, 702/168, 179–188; 324/601
See application file for complete search history.

(56) References Cited

U.S. PATENT DOCUMENTS

| | | | |
|---|---|---|---|
| 4,989,154 A | | 1/1991 | Yamashita et al. |
| 5,047,725 A | * | 9/1991 | Strid et al. .................... 324/601 |
| 5,442,296 A | | 8/1995 | Schiek et al. |
| 6,023,209 A | | 2/2000 | Faulkner et al. |
| 6,963,209 B1 | | 11/2005 | Gailus et al. |
| 7,054,776 B2 | * | 5/2006 | Bradley et al. ................ 702/107 |
| 7,643,957 B2 | * | 1/2010 | Daniel ........................... 702/109 |
| 2004/0070405 A1 | | 4/2004 | Wu et al. |
| 2007/0040565 A1 | | 2/2007 | Jayabalan et al. |

OTHER PUBLICATIONS

Ross A. Speciale, "A Generalization of the TSD Network-Analyzer Calibration Procedure, covering n-Port Scattering-Parameter Measurements, Affected by Leakage Errors," IEEE Transactions on Microwave Theory and Techniques, vol. MTT-25, No. 12, Dec. 1977, pp. 1100-1115.

Christophe Sequinot, et al., "Multimode TRL—A New Concept in Microwave Measurements: Theory and Experimental Verification," IEEE Transactions on Microwave Theory and Techniques. vol. 46, No. 5, May 1998, pp. 536-542.

F.M. Ghannouchi, Y. Xu and R.G. Bosisio, "One-step connection method for the measurement of N-port microwave networks using six-port techniques," IEEE Proc.-Microw. Antennas Propag., vol. 141, No. 4, Aug. 1994, pp. 285-289.

Louis D. Silverstein, et al., "Hybrid spatial-temporal color synthesis and its applications," Extended version of a combined contribution of three papers presented at the 2005 SID International Symposium held May 24-27, 2005, in Boston, Massachusetts, Copyright 2006, pp. 3-13.

(Continued)

*Primary Examiner* — Andrew Schechter
*Assistant Examiner* — Phuong Huynh
(74) *Attorney, Agent, or Firm* — Chernoff, Vilhauer, McClung & Stenzel

(57) ABSTRACT

A method of compensating a calibration for a vector network analyzer includes performing calibrations on at least a pair of ports to determine error terms associated with each port wherein at least one of the error terms is based upon selecting the reactance of the load standard from a set of potential values in a manner such that the reference reactance errors are reduced.

6 Claims, 32 Drawing Sheets

A typical configuration of a Vector-Network-Analyzer probing setup using the LRRM calibration.

OTHER PUBLICATIONS

Pierre De Greef, Hendriek Groot Hulze and Seyno Sluyterman, "54.4: Adaptive Dual Pulse Backlight for LCD-TV displays," SID 06 Digest, pp. 1712-1715.

Boutros, et al., "High Performance Gan HEMTs on 3-inch SI-SIC Substrates" In: The International Conference on Compound Semiconductor Manufacturing Technology. Section 2.3, 2004 [retrieved on Sep. 13, 2009], <http://gaas.org/Digests/2004/2004Papers/2.3.pdf>.

* cited by examiner

Impedance Standard Substrate

Probe Station (not shown)

A typical configuration of a Vector-Network-Analyzer probing setup using the LRRM calibration.

Eight-term error model for the reference planes:
(a) at the probe tip, and
(b) at the center-of-Thru (Line) reference plane.

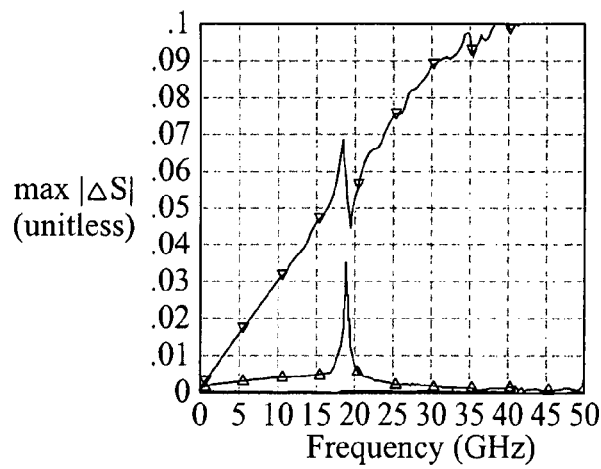

FIG. 3

Worst-case error bounds from calibration comparison
for various calibrations compared to the reference
1 ps eLRRM with automatic load inductance determination.

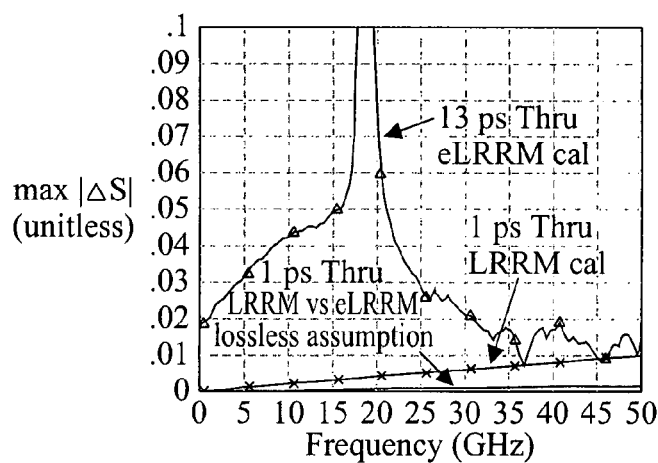

FIG. 4

This view has expanded the Y-axis scale of the
worst-case error bound traces.

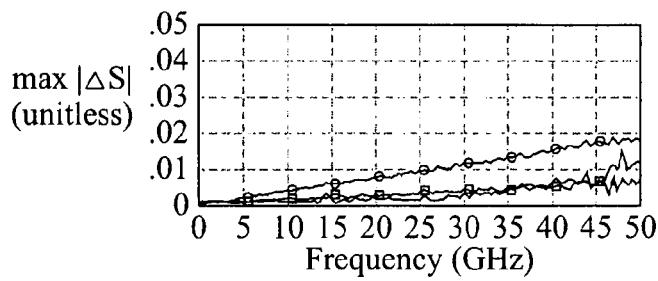

FIG. 5

For purposes of understanding the significance of the error magnitudes
these curves show the impact of simple instrument calibration
repeatability, choice of standards, and from repeated probe alignment.

LINE-REFLECT-REFLECT MATCH CALIBRATION

CROSS-REFERENCE TO RELATED APPLICATIONS

This application claims priority to U.S. Provisional App. No. 60/831,940, filed Jul. 18, 2006, and is a continuation-in-part of U.S. patent application Ser. No. 11/449,979, filed Jun. 9, 2006, now abandoned; which claims the benefit of U.S. Provisional App. No. 60/690,460, filed Jun. 13, 2005 and U.S. Provisional App. No. 60/689,597, filed Jun. 11, 2005.

BACKGROUND OF THE INVENTION

A calibration technique for testing a device under test.

The Line-Reflect-Reflect-Match (LRRM) vector network analyzer calibration method with automatic load inductance correction has been an accepted and reliable work horse for on-wafer probing measurement for more than a decade. LRRM is valued for its relative insensitivity to small errors in probe placement that are inherent in microwave probing. Typical LRRM calibrations compare favorably with the NIST reference multiline Thru-Reflect-Line (TRL) method yet require only simple fixed spacing standards using the same set as the Short-Open-Load-Thru (SOLT) method.

In the most common use of the LRRM algorithm, impedance standard substrate standards are positioned to allow probing using fixed spacing probes with minimal spacing, as illustrated in FIG. 1. The Line (or Thru) standard is kept electrically short and the reflect and match standards are situated at the probe tips, approximately co-located with the desired measurement reference planes. This configuration reflects design choices made to minimize impacts from non-ideal or unknown behavior of the Line standard in loss, frequency dependent delay, or impedance match. The configuration also facilitates convenient automation of the calibration using only substrate moves resulting in not only the convenience of a one-button calibration but also enhanced repeatability by avoiding probe repositioning.

As maximum testing frequency has risen to 110 GHz and beyond, the electrical length and inductive reactance of existing, commonly used calibration standards has grown to where these impacts are no longer transparent. This calibration error is not necessarily the dominant measurement error since probe to DUT positioning uncertainty also has greater impact at higher frequency. Also, less frequent but important situations (such as probe card measurement of larger die size) require electrically long lines for the Line standard used in calibration, encountering at even lower frequency the limitations.

An enhanced LRRM (eLRRM) technique for improved handling of non-ideal and electrically long Line standards which uses a more robust load inductance extraction method is desirable.

BRIEF DESCRIPTION OF THE SEVERAL VIEWS OF THE DRAWINGS

FIG. 3 illustrates worst case error bounds from calibration comparison.
FIG. 4 illustrates expanded y-axis scale of worse case error bound traces.
FIG. 5 illustrates error magnitudes.

DETAILED DESCRIPTION OF PREFERRED EMBODIMENT

Figure 1:
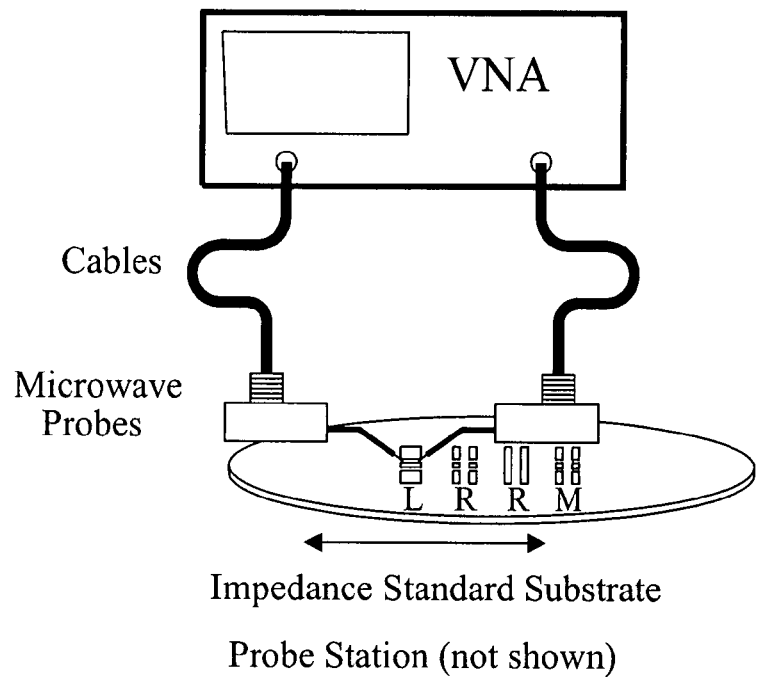
FIG. 1 illustrates a calibration system.
Figure 2:
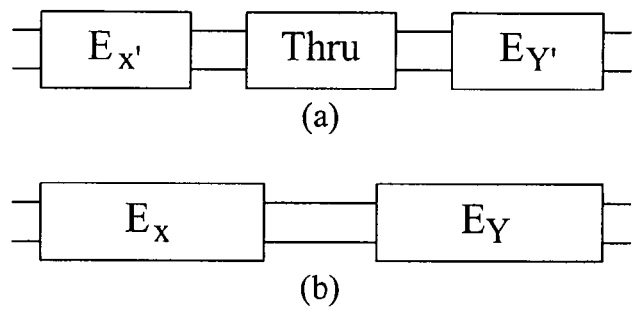
FIG. 2 illustrates an error model.

An enhanced eLRRM technique may be accomplished at the expense of using more a priori knowledge of at least approximate standard behavior than was required by LRRM. One implementation of an LRRM is based upon an eight-term error model. In FIG. 2, the two-port ABCD parameters (voltage-current cascade parameters) are used to describe the measurement configuration for the Line standard. This standard is labeled Thru in FIG. 2. Thru and Line are used interchangeably when describing probing calibrations since all connection of probes requires some form of intermediate structure (like a line). No direct connection exists like would be the case for coaxial ports of different genders.

The goal of the LRRM calibration is to compute the terms of $E_x$ and $E_y$ from measurements of the various standards. With these terms known it becomes possible to take the raw measurement (i.e., the measurement of the error box, DUT, error box cascade) and extract the corrected DUT behavior. It is generally understood that only seven of the eight terms are necessary to be known to allow S-parameter correction since for linear devices the absolute magnitudes and phase of waves incident and exiting the devices need not be known, just their ratios.

The Thru measurement along with the known behavior of the standard provides four complex equations. Each unknown reflect standard pair measurement gives one complex known created by the requirement that the paired reflects are equal at the two ports. A single match standard measurement provides a seventh complex equation when the load is known. Note: when more is known about the standards other choices may be made. For the case of the automatic determination of load inductance the system may assume the magnitude of the reflection coefficient of the open is known and that the load is an R-L series circuit with known R and unknown, frequency independent L.

The LRRM technique may start by solving for the error terms to the center of the Thru reference plane as shown in FIG. 2(b). Once this process is completed then the known Thru behavior may be used to move the reference plane to the probe tips. It may be observed that it is not just the Thru that is known but actually the behavior of the two mirror-identical half-circuits that in cascade are equal to the Thru.

Expressing the cross-talk and switching term corrected measured Thru standard ABCD parameters, $E_{MT}$, as the cascade product gives:

$$E_{MT} = E_X \cdot E_T \cdot E_Y = E_X \cdot E_{T/2} \cdot E_{T/2} \cdot E_Y = E_{X'} \cdot E_{Y'} \quad (1)$$

where the $E_{T/2}$ terms represent the behavior of the half-thru structure and the probe tip reference plane error boxes $E_{X'}$ and $E_{Y'}$ can be found from the center-of-thru reference plane error boxes $E_X$ and $E_Y$ using:

$$E_{X'} = E_X \cdot (E_{T/2})^{-1} \quad (2)$$

and $$E_{Y'} = E_Y \cdot (E_{T/2})^{-1}. \quad (3)$$

The normalized ABCD parameters of the error boxes are what is desired. Choosing $D_X$ as the one term to leave unknown one has:

$$E_X = \begin{bmatrix} A_X & B_X \\ C_X & D_X \end{bmatrix} = \begin{bmatrix} \underline{A}_X & \underline{B}_X \\ \underline{C}_X & \underline{D}_X \end{bmatrix} \cdot D_X \quad (4)$$

with $$\begin{bmatrix} \underline{A}_X & \underline{B}_X \\ \underline{C}_X & \underline{D}_X \end{bmatrix} \equiv \begin{bmatrix} \frac{A_X}{D_X} & \frac{B_X}{D_X} \\ \frac{C_X}{D_X} & 1 \end{bmatrix}, \quad (5)$$

and $$E_Y = \begin{bmatrix} A_Y & B_Y \\ C_Y & D_Y \end{bmatrix} = \begin{bmatrix} \underline{A}_Y & \underline{B}_Y \\ \underline{C}_Y & \underline{D}_Y \end{bmatrix} \cdot \frac{1}{D_X} \quad (6)$$

with $$\begin{bmatrix} \underline{A}_Y & \underline{B}_Y \\ \underline{C}_Y & \underline{D}_Y \end{bmatrix} \equiv \begin{bmatrix} A_Y \cdot D_X & B_Y \cdot D_X \\ C_Y \cdot D_X & D_Y \cdot D_X \end{bmatrix}. \quad (7)$$

Since $E_{MT} = E_X \cdot E_Y$ one can determine $E_Y$ from $E_{MT}$ once $E_X$ is known using:

$$E_Y = (E_X)^{-1} \cdot E_{MT} \quad (8)$$

$$E_Y = \frac{1}{D_X} \cdot \frac{1}{\underline{A}_X - \underline{B}_X \cdot \underline{C}_X} \cdot \begin{bmatrix} 1 & -\underline{B}_X \\ -\underline{C}_X & \underline{A}_X \end{bmatrix} \cdot \begin{bmatrix} t_1 & t_2 \\ t_3 & t_4 \end{bmatrix}. \quad (9)$$

where the $E_{MT}$ matrix is known from the measurement term-by-term:

$$E_{MT} = \begin{bmatrix} t_1 & t_2 \\ t_3 & t_4 \end{bmatrix}. \quad (10)$$

The next tool desired is a set of general expressions that allow one to relate the measured behavior of a one-port termination with the actual behavior of the standard. The measured impedance may be obtained from actual admittance using:

$$Z_{x,meas} = \frac{\underline{A}_X + \underline{B}_X \cdot Y_{x,act}}{\underline{C}_X + Y_{x,act}}, \quad (11)$$

and $$Z_{y,meas} = \frac{\underline{B}_Y \cdot Y_{y,act} + \underline{D}_Y}{\underline{A}_Y \cdot Y_{y,act} + \underline{C}_Y} \quad (12)$$

for ports X and Y respectively. The inverse expressions are used for correction and are:

$$Y_{x,act} = \underline{C}_X \cdot \frac{Z_{x,meas} - \frac{\underline{A}_X}{\underline{C}_X}}{\underline{B}_X - Z_{x,meas}}, \quad (13)$$

and $$Y_{y,act} = \frac{\underline{C}_Y \cdot Z_{y,meas} - \underline{D}_Y}{\underline{B}_Y - \underline{A}_Y \cdot Z_{y,meas}}. \quad (14)$$

For the condition of a reflect pair standard providing equal actual admittance at both ports one can equate (13) with (14) and using (9) identify the expression:

$$P_1 \cdot a_1 + P_2 \cdot a_2 = V_a \quad (15)$$

where $$P_1 = \left( \frac{\underline{A}_X}{\underline{C}_X} + \underline{B}_X \right), P_2 = \left( \frac{\underline{A}_X \cdot \underline{B}_X}{\underline{C}_X} \right), \quad (16\text{-}17)$$

$$a_1 = t_1 \cdot Z_{y,meas} - t_2 + t_3 \cdot Z_{x,meas} \cdot Z_{y,meas} - t_4 \cdot Z_{x,meas}, \quad (18)$$

$$a_2 = 2 \cdot t_4 - 2 \cdot t_3 \cdot Z_{y,meas}, \quad (19)$$

and $$V_a = 2 \cdot t_1 \cdot Z_{x,meas} \cdot Z_{y,meas} - 2 \cdot t_2 \cdot Z_{x,meas}. \quad (20)$$

For the second reflect standard one obtains a second expression similar to (13):

$$P_1 \cdot b_1 + P_2 \cdot b_2 = V_b \quad (21)$$

where the $b_1$, $b_2$, and $V_b$ terms are found using (18)-(20) except using the measured impedances from the second pair of reflects.

The two equations (15) and (21) may be solved for the two unknowns yielding:

$$P_1 = \frac{V_a \cdot b_2 - V_b \cdot a_2}{a_1 \cdot b_2 - a_2 \cdot b_1} \quad (22)$$

and $$P_2 = \frac{V_b \cdot a_1 - V_a \cdot b_1}{a_1 \cdot b_2 - a_2 \cdot b_1}. \qquad (23)$$

From the definitions of $P_1$ and $P_2$ in (16) and (17) one forms a quadratic equation with roots $A_X/C_X$ and $B_X$ $$B_X^2 - P_1 \cdot B_X + P_2 = 0 \qquad (24)$$

or $$\left(\frac{A_X}{C_X}\right)^2 - P_1\left(\frac{A_X}{C_X}\right) + P_2 = 0, \qquad (25)$$

with solutions given by:

$$\frac{A_X}{C_X}, B_X = \frac{P_1 \pm \sqrt{P_1^2 - 4 \cdot P_2}}{2} \qquad (26)$$

where the root selection is determined by trial and error using the needed sign of the corrected open reflection coefficient.

If there exists a termination (e.g., load) with known behavior at the center-of-thru reference plane, one can determine $C_X$ from a variation on (13):

$$\underline{C}_X = Y_{x,act,load} \cdot \frac{\underline{B}_X - Z_{x,meas,load}}{Z_{x,meas,load} - \frac{A_X}{C_X}} \qquad (27)$$

or alternatively one can determine the $C_X$ term using the automatic load inductance extraction process outlined below.

Once the $C_X$ is known and applying (9) one has complete determination of the normalized error boxes at the center-of-thru reference plane. Using (2) and (3) the reference planes are moved to the probe tips. In normal application the probe tip error box ABCD parameters are converted to S-parameters and the eight-term error model is converted to a twelve-term model using switching terms and cross-talk terms identified when originally computing the eight-term error model reduction.

It is desirable to automatically extract the load inductance, preferably as follows.
Using a variation of (11)

$$Y_{x,meas} = \frac{\underline{C}_X + Y_{x,act}}{\underline{A}_X + \underline{B}_X \cdot Y_{x,act}} \qquad (28)$$

One may note the following special cases:
i. Perfect open, $Y_{X,act}=0$, $Y_{X,meas}=C_X/A_X$
ii. Perfect short, $Y_{X,act} \to \text{infinity}$, $Y_{X,meas} \to 1/B_X$.
These terms are independent of the load definition used in (27) and solely determined by the open and short.

If one makes an estimate of $C_X$ and use it to complete the correction then the resultant estimate correction of a measurement at port X would be given by:

$$Y_{x,est} = \underline{C}_{X,est} \cdot \frac{Z_{x,meas} - \frac{A_X}{C_X}}{\underline{B}_X - Z_{x,meas}}. \qquad (29)$$

Forming the ratio of (27) for the two situations where an estimate is used and where the actual $C_X$ is used results in a simple relation since the fractional part of (27) drops out:

$$\frac{Y_{x,est}}{Y_{x,act}} = \frac{\underline{C}_{X,est} \cdot \frac{Z_{x,meas} - \frac{A_X}{C_X}}{\underline{B}_X - Z_{x,meas}}}{\underline{C}_{X,act} \cdot \frac{Z_{x,meas} - \frac{A_X}{C_X}}{\underline{B}_X - Z_{x,meas}}} = \frac{\underline{C}_{X,est}}{\underline{C}_{X,act}} \equiv \alpha. \qquad (30)$$

Using a load extraction method one may assume an ideal load ($Y_{X,est,load}=1+j0$) in (27) to obtain the estimate $C_{X,est}$. The ratio defined in (30) is determined solely by the ratio of the estimated load to the ideal load which will be the error ratio for measurement of any DUT:

$$Y_{x,est,dut} = \alpha \cdot Y_{x,act,dut} = \frac{Y_{x,est,load}}{Y_{x,act,load}} \cdot Y_{x,act,dut}. \qquad (31)$$

For a reflect (e.g., open) standard known to be reactive only at the center-of-thru reference plane ($Y_{X,act,open}=0+jB_{open,act}$) the estimated behavior ($Y_{X,est,open}=G_{open,est}+jB_{open,est}$) is given by:

$$Y_{x,est,open} = \alpha \cdot Y_{x,act,open} = \alpha \cdot (0 + jB_{open,act}). \qquad (32)$$

Remembering that the ratio term may be complex and equating the real parts of (32) means that:

$$\text{real}\left(\frac{1}{\alpha}\right) \cdot G_{open,est} - \text{imag}\left(\frac{1}{\alpha}\right) \cdot B_{open,est} = 0 \qquad (33)$$

$$\Rightarrow \frac{\text{imag}\left(\frac{1}{\alpha}\right)}{\text{real}\left(\frac{1}{\alpha}\right)} = \frac{-\omega \cdot L_{act}}{R_{act}} = \frac{G_{open,est}}{B_{open,est}} \qquad (34)$$

since $$\frac{1}{\alpha} = \frac{Z_{x,est,load}}{Z_{x,act,load}} = \frac{Z_{x,est,load}}{Z_{x,act,load}} \cdot \frac{Z_{x,act,load}^*}{Z_{x,act,load}^*} \qquad (35)$$

$$\Rightarrow \frac{1}{\alpha} = \frac{R_o}{|Z_{x,act,load}|^2} \cdot (R_{act} - j\omega \cdot L_{act}) \qquad (36)$$

Solving (36) for the load inductance yields:

$$L_{act} = -\frac{R_{act} \cdot G_{open,est}}{\omega \cdot B_{open,est}}, \qquad (37)$$

where R, G, and B are the real part of the actual load impedance and the components of the estimated behavior of the open standard using the perfect assumption, all at the center-of-thru reference plane.

The use of ABCD parameters, impedances, and admittances in the derivation avoids a possible problem associated with the implicit assumption of the existence of an intermediate reference impedance.

While LRRM is functional, it does have limitations and assumptions. One such limitation leads to the potential for a reflect singularity with a long Thru. When computing the LRRM calibration the system relies on uniqueness of the reflect standards to provide information (equations) to help solve for the error-terms (unknowns). A problem may be observed when using probe tip reflect standards and the thru line is approximately one-quarter wavelength long. At this frequency (and odd multiples) ideal open and shorts located at the probe tip are contributing the same information, preventing a proper cal (resonant spikes are observed on the open verification plot).

The LRRM algorithm is largely computed with a center-of-thru reference plane. Re-computing these (probe-tip) reflects for their apparent value at a center-thru reference plane results in impedances with zero real part and opposite sign imaginary part when the resonant spikes occur. It is apparent from experimentation that the two reflects are providing the same information in this situation. The solution to the system given by (15) and (21) is singular and the denominator of (22) goes to zero. This degenerate case is inherent in the use of two reflects for calibration and cannot be readily fixed mathematically. The situation needs to be avoided either by staying with electrically short Thru standards or by the use of offset reflect standards. Reflects physically located at the center-of-Thru reference plane (or sufficiently close) will also eliminate this problem. For the Thru with delay of 1 ps this effect is not a significant contributor of error below 110 GHz but may need to be considered for higher frequencies.

Another such assumption is that the Thru impedance is matched to the system impedance, which may not be the case. The Thru impedance in the LRRM algorithm was presumed to be equal to the target system impedance. This creates a limitation when deliberately calibrating to a different system impedance (such as 75 ohms) which is at times desirable, but it also introduces errors in 50 ohm calibration when the thru deviates from 50 ohms. The impact is larger when the thru is electrically long. The thru impedance is used when shifting between the native center-of-Thru LRRM reference plane and target calibration reference planes. Thru impedance, delay, and the usual VNA offset transmission line loss model are used to calculate the known scattering behavior of the distributed elements allowing the calculation of the reference plane shift. This is used in the load inductance extraction process as well as at the end of the calibration to set the desired final reference plane (this location is determined by the defined delay/length of the thru).

Typical implementations of the LRRM algorithm have implicitly assumed the Thru impedance to be equal to the target system impedance of calibration. There was no separate entry for the impedance of the Thru transmission line. For electrically short and nearly equal system and Thru impedance the error introduced as a result is small. However, for long lines even a small impedance difference can produce dramatic side effects.

More generally, any error in the known Line behavior can cause incorrect probe-tip error box determination with the greatest impact for a longer Line. Only the TRL family of calibrations currently can accurately move reference planes when faced with unknown line behavior. Determining the line behavior is a unique part of the TRL calibration process.

There are also assumptions and limitations made in the extraction of the load inductance. One such assumption is that the load Z is equal at the probe-tip and the Thru-center. The algorithm described above does not effectively allow for differences between the load measured at the probe-tip reference plane (really the edge of the thru) and measured at the center-of-thru reference plane. The algorithm can accurately give us the ratio of $L_{act}/R_{act}$ at the center of the Thru (although this may not be true when there is loss in the Thru or when $R_{load} \neq Z_{system}$). One fundamental assumption is that the load has constant R, series R-L behavior at the location set by the thru delay and load offset entries. This means that the R(f) is a known constant $R_o$ at this reference plane and the L/R is known at the thru center.

The previous implementations of the LRRM algorithm improperly assumes $R=R_o$ at the center of the thru and calculate $L_{act}$ from the $L_{act}/R_{act}$. LRRM then (again improperly) assumes that at the load reference plane $Z_{load}$ is $R_o+j\omega L_{act}$ (using $L_{act}$ from the thru-center calculation) and uses this value and the line behavior to determine the effective Z at the thru-center reference plane by reference plane shift. This Z is then used as the effective $Z_o$ of the calibration and the error terms are corrected to renormalize the $Z_o$ to the desired system impedance (usually 50 ohms). This error becomes more significant when L is large and when the reference plane shift is a greater phase rotation (thru electrical length larger than a small fraction of a wavelength) causing the assumptions of similar behavior at the two reference planes to fail.

A fundamental assumption in the load inductance algorithm described above for the ability to determine the L/R ratio is that the loss of the open is zero at the center-of-thru reference plane. For a line that has even a small amount of loss this assumption will not be perfectly true. A typical 2 ps Thru standard can have as much as 0.04 dB round-trip loss at 40 GHz. While small relative to other measurement errors, this offset on the open reflection verification plot is significant compared to the default display scale and is perceived as a problem. More importantly, the effect on the extracted inductance may be significant.

Another assumption is the use of a primitive L correction when load R is not equal to $Z_{System}$. In the LRRM algorithm, if the resistance value in the load is not equal to the target system/Thru impedance then the apparent load inductance value is changed. The situation occurs when mapping the probe-tip load to the Thru-center introducing a standing wave. The assumption of an electrically short Thru with small load L led to a correcting adjustment value determined by a simple excess inductance model. The excess inductance is the difference between the total line inductance and the inductance the line would have had if it were matched. The adjustment used in prior implementations was given by:

$$L_{adj} = \Delta\text{delay} \cdot \left(1 - \frac{loadR}{Z_{o,sys}}\right). \tag{36}$$

This calculation assumes that the thru is electrically very short and determines a single, constant-frequency correction. For significant Thru electrical length the effect is frequency dependent and improperly modeled with this approximation. The error may be significant in practical cases making this correction not generally useful. While it is not a heavily used case, the expectation is that entering a non-matched resistor value should work properly. It won't when the thru has non-zero electrical length with the previous implementation.

In order to overcome some or all of the aforementioned shortcomings an enhanced version of the LRRM technique, referred to as eLRRM, is desirable. The inadequate modeling of the Thru discussed is compensated for using a modified technique and a more robust load inductance determination technique has been developed that is better suited to the case with an electrically long Thru.

To correct the limitations for the load inductance method discussed is best performed using a new paradigm. The previous method fundamentally requires moving a determined L/R ratio from one reference plane to another if longer Thrus are to be allowed. It is not feasible to make such a translation of the ratio, only for a specific impedance value.

The enhanced LRRM load inductance approach includes the following:

1. Determine a set of estimated values for the load inductance.
2. Compute the $Z_{load}$ at the probe tip and then translate to the Thru-center reference plane for each value.
3. Renormalize the error box terms for each value.
4. Compute the open verification using error box corrections including moving the reference plane to the probe-tip (or offset open location) for each value.
5. Calculate a difference between the expected reflect magnitude of the reference open and the magnitude of the estimated reflection for each estimated value of load inductance.
6. Choose the inductance value that minimizes the error magnitude summed over a desired frequency range.

In the preferred implementation of eLRRM the estimated values are concentrated densely near a starting point value, but spread over a wide range. This set of estimates allows refining a value more precisely if it is close to the starting point, but will also have a reasonable opportunity to find a distant value. The determined value optionally replaces the starting point allowing repeated calculation to find and then refine the load inductance value.

The translation of the various estimated impedances to other reference planes requires a known line behavior for the various cases of length differences. In the preferred implementation one may use the offset-loss transmission line model used in many network analyzers. Parameters for the VNA model are line $Z_o$, line delay, and a line-loss parameter in GΩ/s. One may simplify this further by determining the line-loss parameter internally from the entered reference loss at a reference frequency for a line with reference delay. For this eLRRM model these entries are enough to determine the complete frequency dependent loss characteristic.

The use of the additional known line behavior remains a limitation since there is no clear way to determine this without resorting to variable probe spacing methods like used in the multiline TRL. When this compromise is unacceptable then it will be necessary to keep the Thru as electrically short as possible to minimize the error.

Two further variations may be considered:
1. Allow for a general but known load impedance to be used in (27).
2. Use of an additional measurement of a long-line to allow determination of the line per-unit-length propagation constant and characteristic impedance allowing precise translation of the reference planes to the probe-tips.

For investigating the algorithm behavior a number of different calibrations were computed. In each case the data were acquired using an Agilent PNA vector network analyzer, Cascade Microtech 12801 probe station, Infinity ground-signal-ground 150 um pitch probes and impedance standard substrate. The WinCal 2006 software (service pack 1 version 4.01) was used to automatically sequence measurement of the needed standards, compute the error terms using the various cases of the LRRM algorithm, and send the error terms back to the PNA. WinCal 2006 also provided the ability to correct an additional reference structure with the calibration results for purposes of recognizing the validity of the calibration. For LRRM the open reflects are often used for this purpose, although use of any S-parameter of any particular structure is supported.

In FIGS. 3-5 computed calibration comparisons are used as the measure of calibration performance. The plotted curves are error-bounds for the measurement difference between two calibrations for a worst-case passive DUT. The trusted 1 ps Thru cal is used as the reference.

The singularity in calibration associated with conjugate reflects behavior at the Thru-center reference plane was presented. While this limitation of LRRM is encountered when using electrically long Thru standards and probe tip reflects. By understanding this limitation of LRRM one can avoid it by the use of an electrically short Thru standard or locating the reflect standards close to the center of the Thru.

It is also noted that a technique that for evaluation of estimated values may rely on matching the translated impedance to the center of the Thru with the calculated L/R ratio. The L/R ratio may be determined based upon the determined $L_{act}/R_{act}$, as previously discussed. The techniques are generally applicable to calculating the error terms for a system with two or more ports by calculating the characteristics of pairs of ports.

Figure 6:
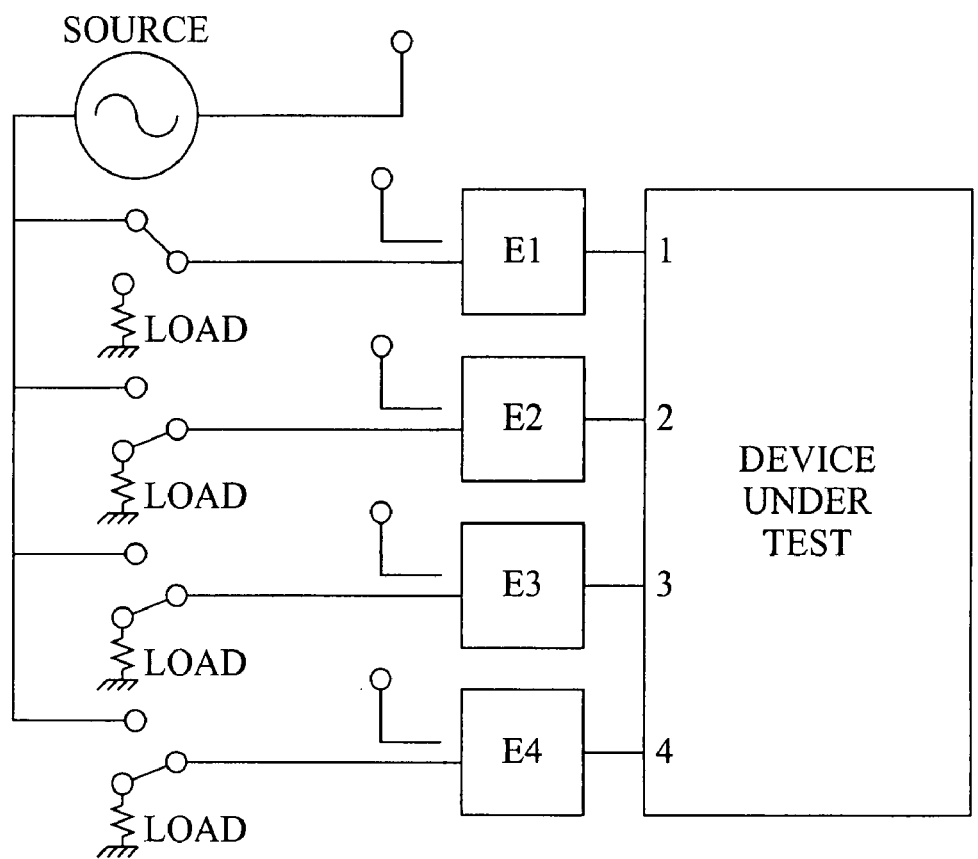
FIG. 6 illustrates a multiport network analyzer.

Referring to FIG. 6, some multi-port network analyzers (greater than two ports) include a series of error models E1, E2, E3, E4 for ports 1, 2, 3, and 4 respectively. A set of switches may be selected between a respective load and the source signal. During calibration of the system one of the ports is connected to the source (and not connected to its respective load), with the remaining ports connected to the respective internal loads. It is noted that each of the internal loads are not perfect loads so they need to be considered during the calibration.

One technique to calibrate a 4-port system is to perform short-open-load test for each of the four ports. Then the 6 Thru paths are tested, for a total of 10 separate tests. In the case of a 12 port network analyzer, this would result in 66 separate tests, which is highly burdensome. In some cases, the number of Thru tests may be reduced by inferring information. The SOLT (short-open-load-thru) technique tends to be sensitive to probe placement and tends to be sensitive to known values of the standards, and thus with a significant number of probe placements is exceptionally prone to significant errors.

Figure 7:
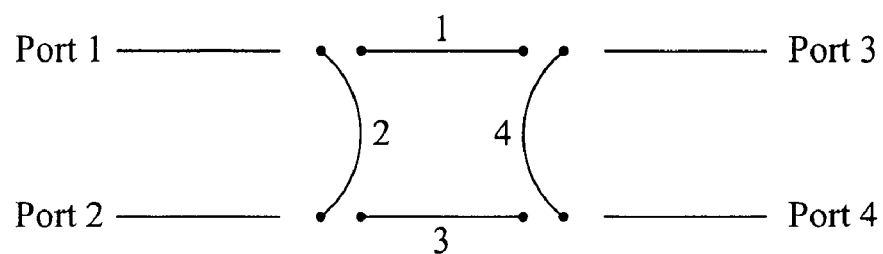
FIG. 7 illustrates a 4-port with loopbacks.

Referring to FIG. 7, to perform this SOLT multi-port (4+) calibration the paths 2 and 4 are loop-backs. In practice, for high frequency calibrations, it is difficult to construct a high quality curved co-planar waveguide. Such curved co-planar waveguides tend to include additional modes of propagation which further introduce errors.

After further consideration it was determined that using the LRRM technique requires minimal knowledge of the standard except for the Thru path. Accordingly, by using the LRRM technique (or eLRRM) a 1 port calibration may be done on each of the ports to obtain information for E1, E2, E3, and E4. The data obtained using the LRRM or eLRRM characterizes equivalently characterizes the short, open, and load characteristics.

With reference to the SOLR calibration technique, this leaves the reciprocal characteristic to be determined. The SOLR calibration is desirable, especially for this high frequency calibration, is because the reciprocal is better with high frequency calibrations in the sense that it is less sensitive to lower quality loopbacks.

In the system of calibration for multi-port network analyzers, one may use a reference calibration technique to obtain the switching terms. To obtain the most accurate switching terms, preferably a full N port calibration technique is used to extract the switching terms. Also, depending on the hardware, the switching terms may be directly measured.

The revised calibration technique, or any suitable calibration technique may be used with a calibration system.

Historically, the set up and configuration of a probe station has been undertaken by highly trained and experienced engineers and scientists who understand the subtleties of the particular configuration being calibrated and the implications of each aspect of the calibration process. In contrast, the set up and calibration of a probe station is a highly problematic task frequently fraught with possible pitfalls when undertaken by technicians and inexperienced engineers. Since there are many different subtleties that should be considered during the calibration of such a probe station there is a reasonable high likelihood that the user calibrating the devices will tend to perform a calibration out of sequence or otherwise forget to perform or check a necessary aspect of the calibration process. The resulting data set of calibration parameters may appear, to the novice operator, as being accurate but will in fact be seriously flawed. Accordingly, it has been determined that an electronic guide, generally known as a wizard, would be of assistance to the technicians and inexperienced engineers to assist them with calibration of the probe station.

Figure 8:
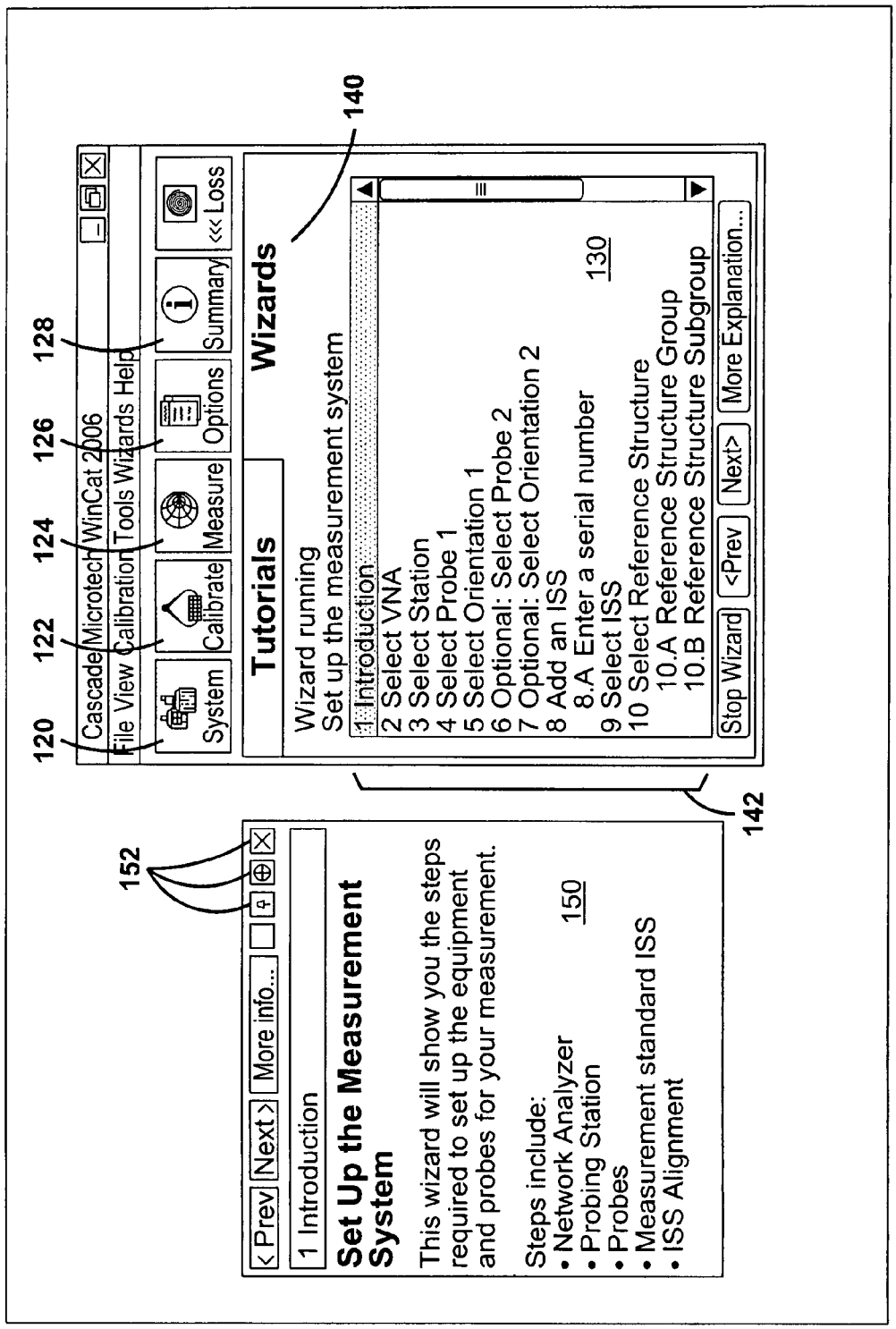
FIG. 8 illustrates a user interface.

Referring to FIG. 8, the wizard includes a first window 100 which displays a selection of the principal tasks 110 for performing an accurate calibration process. The principal tasks 110 include system 120, calibrate 122, measure 124, options 126, and summary 128. A window 130 indicates that the wizard 140 is being used and the steps 142 that the user is guided through by the wizard 140. The wizard 140 provides an assistance window 150 that includes further information regarding the particular step that is being performed by the user. The description in the assistance window 150 corresponds to the particular item being highlighted by the wizard 140.

The assistance window 150 preferably includes textual information that further guides the user through the calibration process. The assistance window 150 preferably includes an indication 160 to the window 130 or other window indicating which step in the process it is related to. In this manner, the assistance window 150 follows the user's actions through the calibration process. In most cases, the assistance window 150 does not actually perform or make any of the changes to the settings or initiate any of the calibration actions. This permits the user to actually set all of the settings and initiate any of the calibration actions in order to properly calibrate the system. This avoids potential problems associated with a wizard actually making some or all of the settings on behalf of the user, which is generally undesirable for calibration given the sensitive nature and possible other issues regarding setup that are not accounted for in the wizard. The assistance window 150 includes a function 152 that permits the window to be positioned in a user selected position on the screen or otherwise be automatically repositioned in an open area of the screen as other screens are moved, open, or otherwise the assistance window 150 requires space to present its information.

Figure 9:
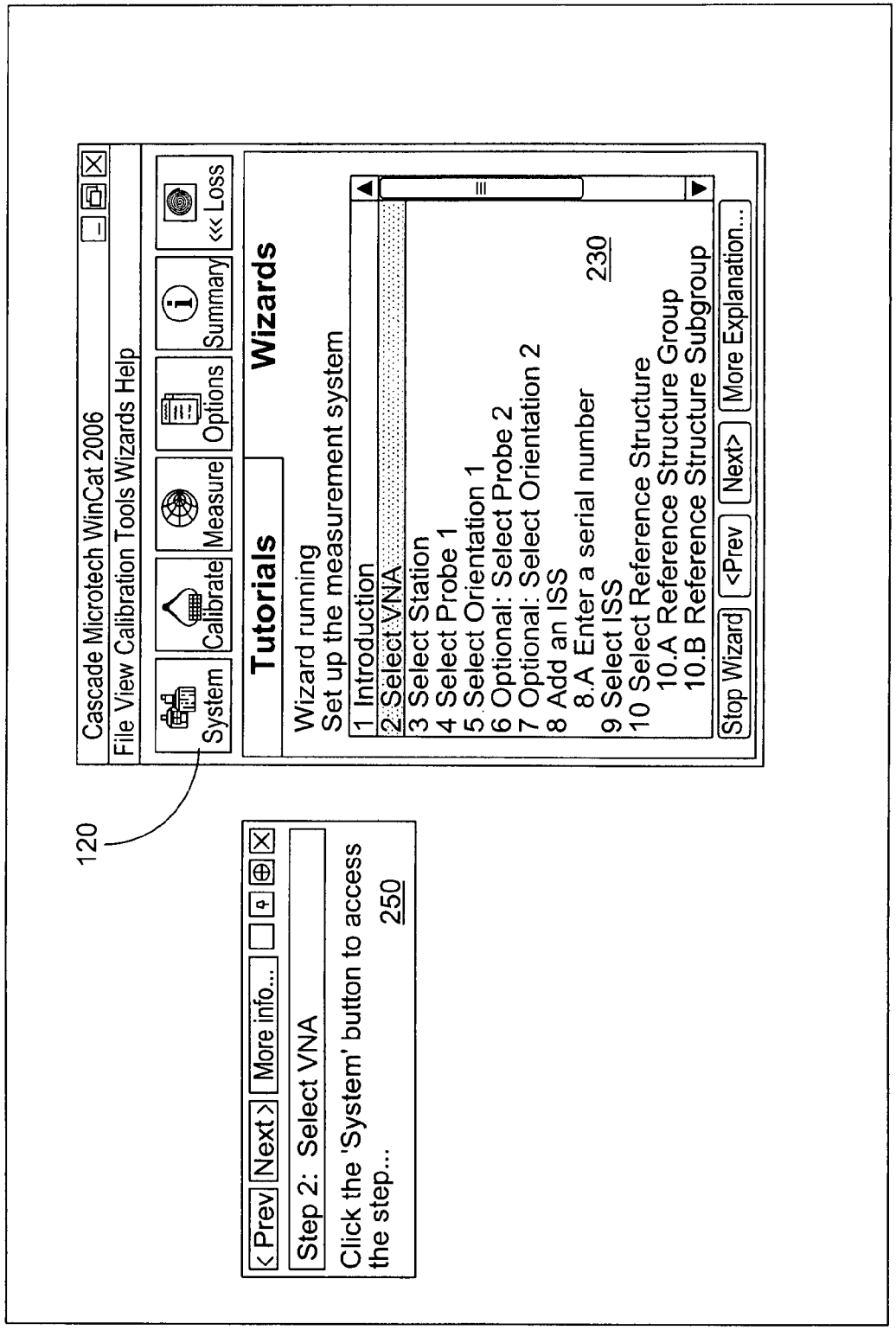
FIG. 9 illustrates a user interface.
Figure 10:
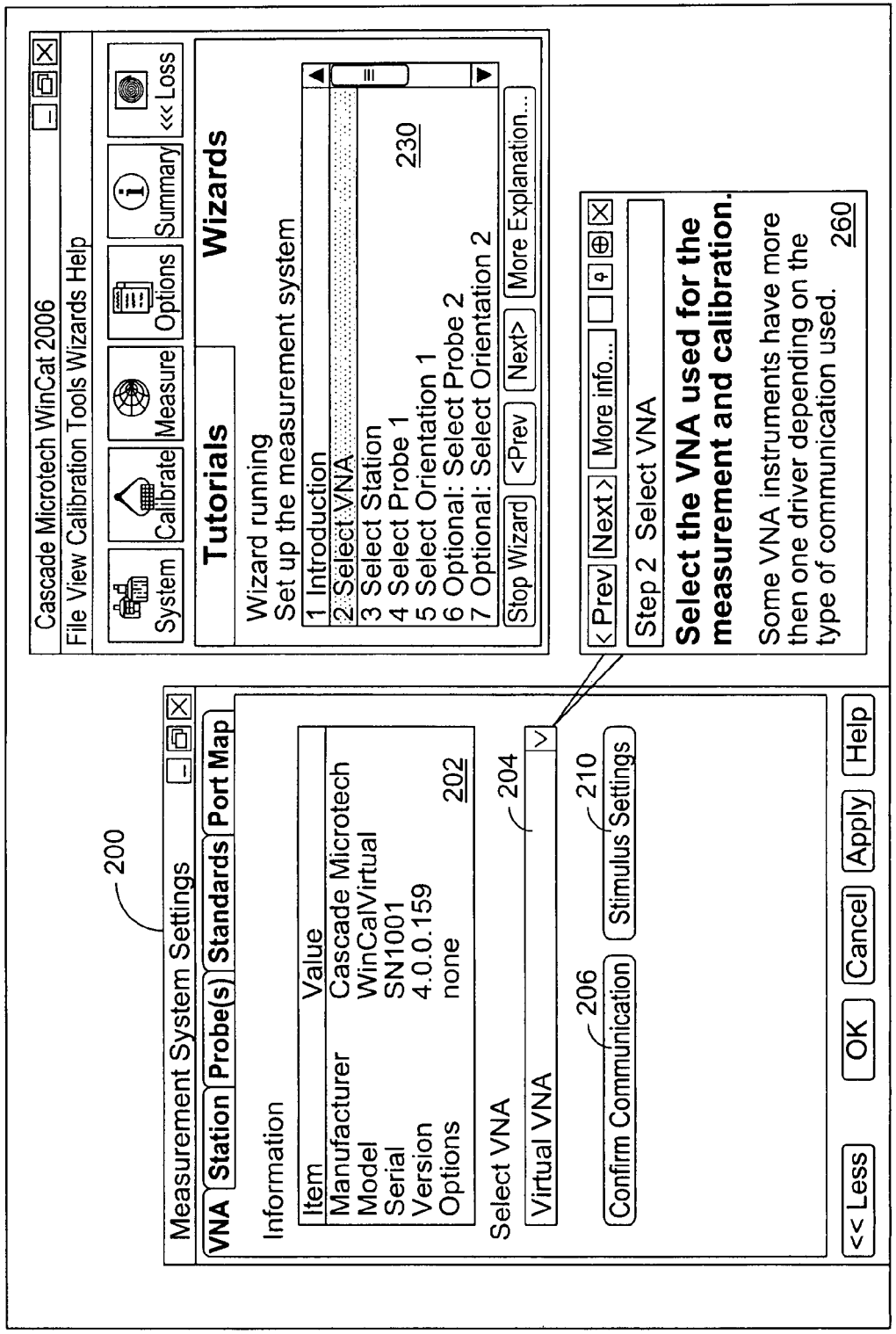
FIG. 10 illustrates a user interface.

To set up the measurement system, as indicated by the assistance window 150, the user may select the 'system' button 120, move to step 2 in the window 130, or otherwise click next in the assistance window 150. Referring to FIG. 9, the second step of the calibration process includes selecting the associated measurement analyzing device, such as an associated vector network analyzer, TDR, etc. The assistance window 250 indicates to the user of the need to press the system button 120. It is noted that the assistance window 250 does not actually perform the selection of the system button 120 but rather indicates to the user of the need to perform this operation. Upon selection of the system button 120, a measurement system settings window 200 is provided, as illustrated in FIG. 10. The VNA that is detected by the system may be indicated in a window 202. The assistance window 260 indicates the possibility of selecting the VNA to be used for the measurement and calibration. The assistance window 260 also includes the location of where the section of the VNA is performed in the measurement system settings window 200. The VNA may also be selected from a user definable or preset list 204 (e.g., pull-down list). In this example, the selected VNA is identified as a Cascade Microtech 'virtual VNA' which is a simulated VNA. A virtual network analyzer is suitable when an actual network analyzer is not currently available or otherwise being used by others. The settings window 202 also indicates the model of the VNA as WinCalVirtual in the case of a virtual VNA; the serial number as SN1001; the version number 4.0.0.159, and the options on the VNA as none. This information permits the user to readily determine if the selected network analyzer is the desired device together with validating version and configuration information of the device. In some cases, the version of the device may be out of date or otherwise inapplicable for the particular testing to be performed, and having this information presented along with the network analyzer selection is suitable to reduce the likelihood of having an unsuitable hardware configuration. Also, the versioning information is useful in the event updates are desirable. The selected VNA 204 is shown in the settings window 202.

A confirm communication button 206 is available to determine whether there is proper communication between the software and the selected network device 204. This is particularly useful when the same network analyzer has more than one potential driver, the selection of which is dependant on the type of communication channel being used (e.g., firewire, USB, GPIB, or other communication protocols). Accordingly, this permits the selection of the appropriate network analyzer, the particular communication protocol currently being used for that network analyzer, and confirm that the selected network analyzer is being used together with the communication protocol being used for the device. In the event that a device different than the selected device is present or the selected device does not acknowledge communication (e.g., improper communication protocol being used or otherwise not interconnected properly), then the user may remedy the communication issue. It is preferable that the option to provide a confirmation of the communication is provided to the user before actually attempting to calibrate or obtain measurements, which in the event of improper communication or improper driver will likely fail. The user may likewise select the stimulus settings 210 for testing the associated network analyzer. The selected settings are normally confirmed by selecting apply.

Figure 11:
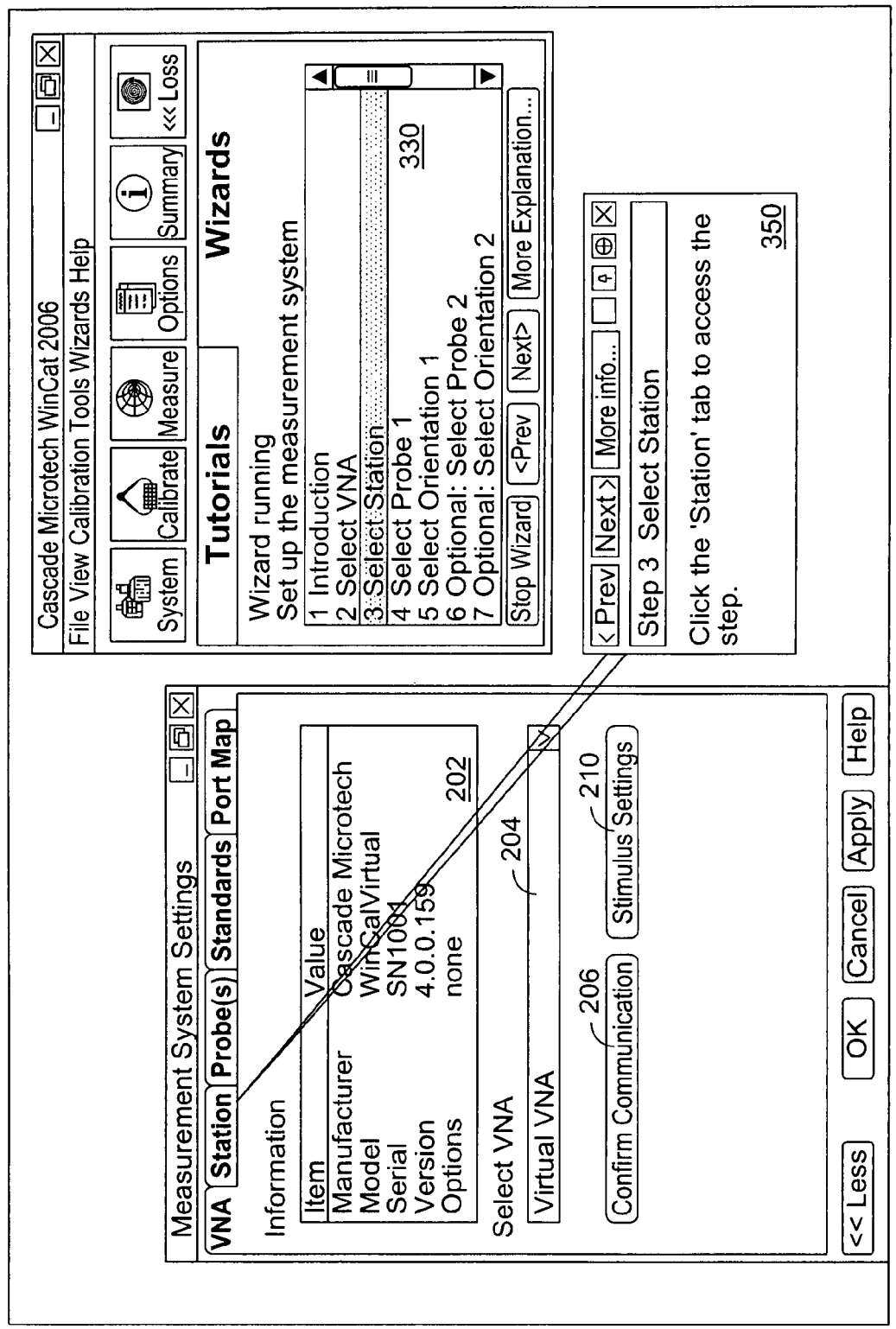
FIG. 11 illustrates a user interface.

After selection of the settings for the VNA described with reference to FIG. 10, the user may click next on the assistance window 260, move to step 3 in the window 230, or otherwise select the station tab in the measurement system settings 200. The assistance window 350 illustrated in FIG. 11 indicates that step 3 in the calibration process is the selection of the "station" tab. The user selects the 'station' tab which changes the window to that illustrated in FIG. 12. The current station that is detected by the system may be indicated in the window 302. The station may also be selected from a user definable or preset list 304 (e.g., pull-down list). In this example, the selected probe station is identified as a Cascade Microtech which is simulated. A virtual probe station is suitable when an actual probe station is not currently available or otherwise being used by others. The settings window 302 also indicates the model as a virtual 12K in the case of a virtual probe station; the serial number is virtual; and the version number is 3. This permits the user to readily determine if the selected probe station is the desired device together with validating version information. The settings window 304 also may indicate the list of available software drivers for the same probe station. In this manner, the user can select from a variety of different software drivers for the same probe station, since some drivers have features or capabilities that may be different from other drivers. A confirm communication button 310 is available to determine whether there is proper communication between the software and the selected probe station 304. A communication setup 306 may be used to change the communication protocol. This is particularly useful when the probe station has more than one driver depending on the type of communication used or otherwise which software is preferable. Accordingly, the device with the desired communication being used or software selection may be selected. In the event that there is not proper communication, then the user may fix the communication issue. It is preferable that the option to provide a confirmation of the communication is provided to the user before actually attempting to take measurements, which in the event of improper communication or improper driver will likely fail. After selecting the probe station, selecting the appropriate communication software, and confirming the communication is established, the user may select apply.

Figure 12:
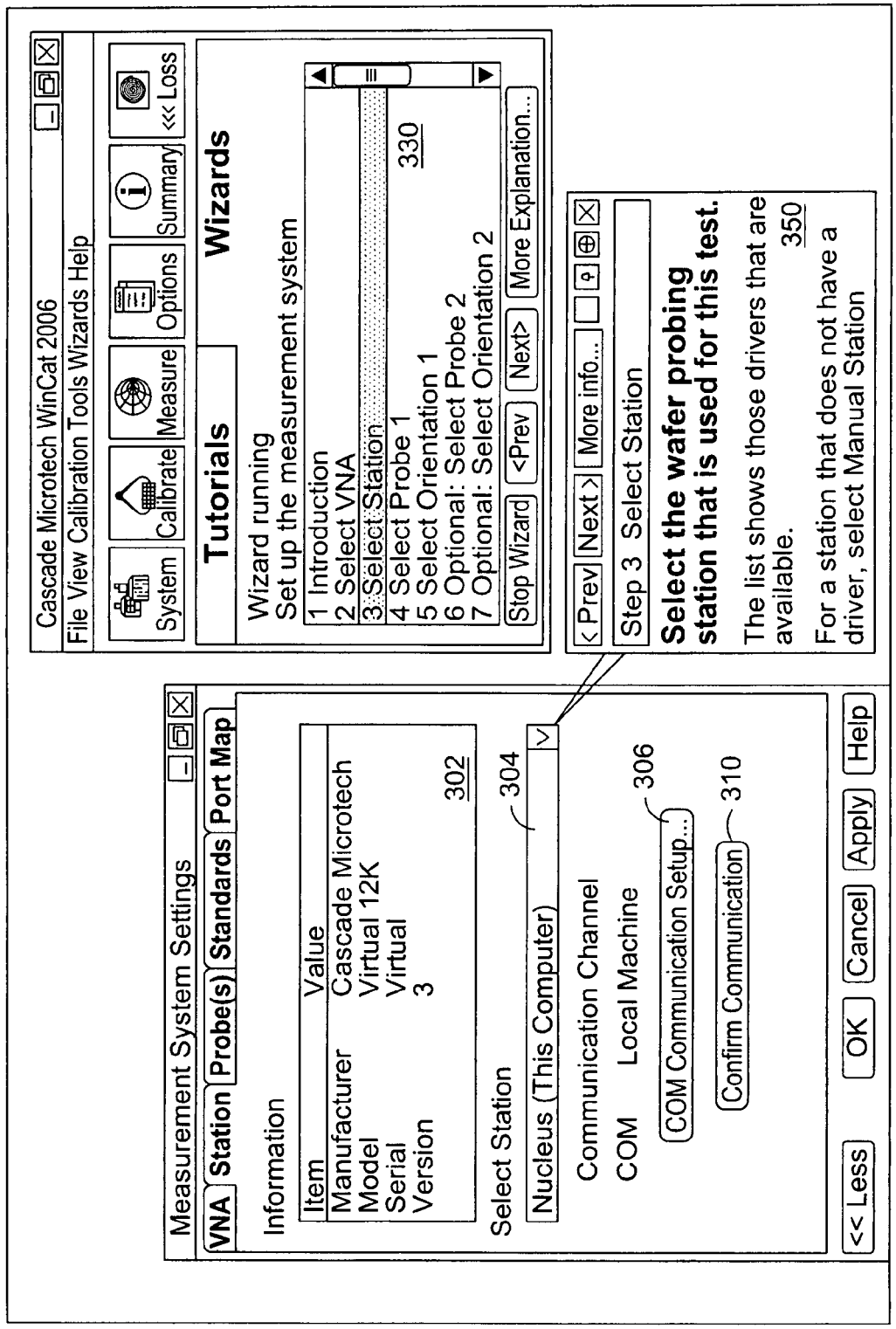
FIG. 12 illustrates a user interface.
Figure 13:
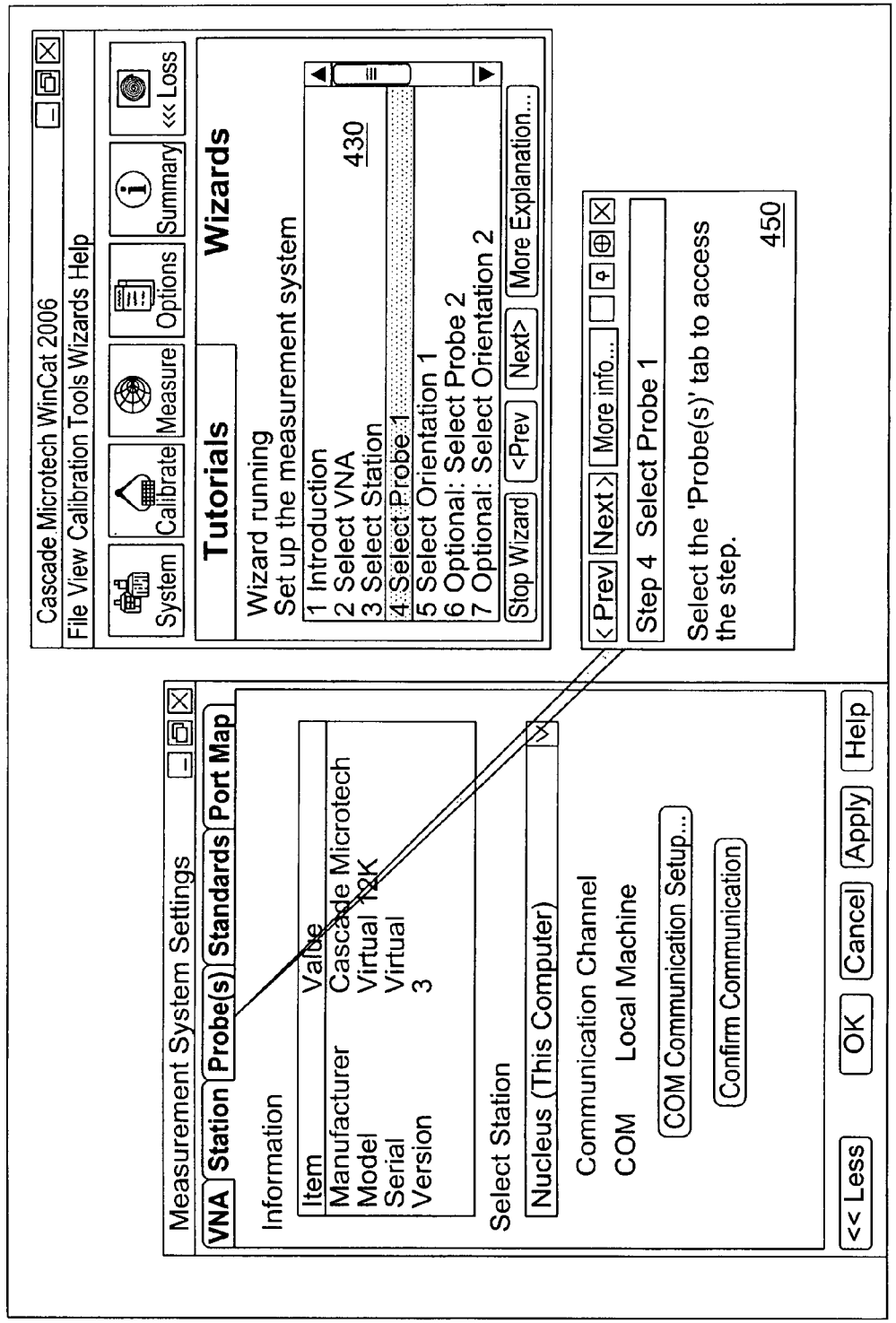
FIG. 13 illustrates a user interface.
Figure 14:
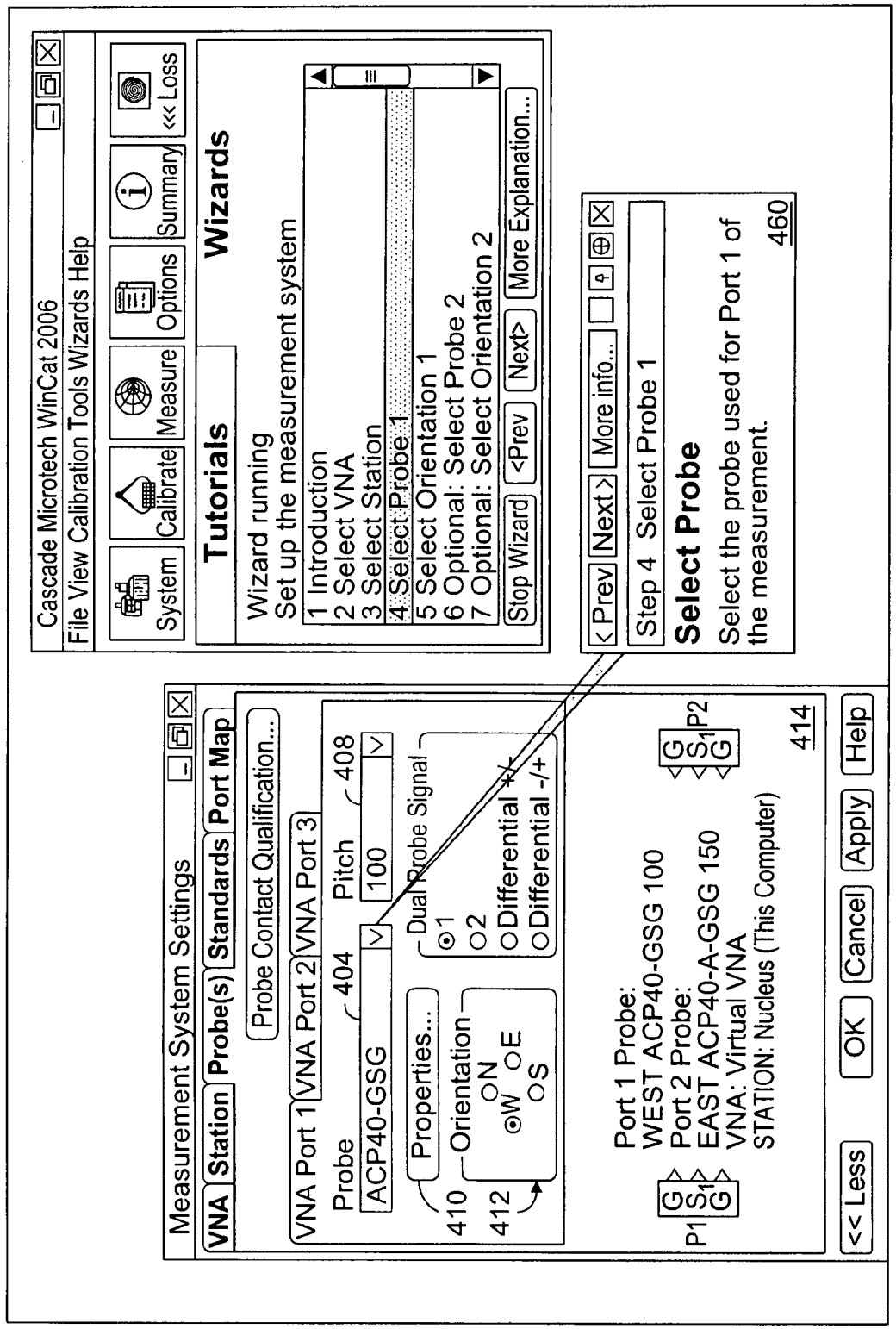
FIG. 14 illustrates a user interface.

After selection of the station settings described with reference to FIG. 12, the user may click next on the assistance window 450, move to step 4 in the window 430, or otherwise select the probe (5) in the measurement system settings 200 as illustrated in FIG. 13. Referring to FIG. 14, the system then indicates at step 4 in the process within the assistance window 460 to select the probe to be used for port 1. The user then selects a probe from a list of possible probes from the selection window 404 that matches the probe attached to port 1 of the vector network analyzer. The selected probe may have one of several different configurations, such as for example, a signal probe, a ground-signal probe, a ground-signal-ground probe, a ground-signal-ground-signal-ground probe, or a differential probe. After selecting the particular probe within the selection window 404 for port 1, the system may automatically associate the appropriate measurement characteristics with the particular probe. In many cases, the measurement characteristics of the particular probe are provided by the manufacturer which are automatically or manually selected by the properties button 410. In other cases, the user may define the measurement characteristics of the probe by the properties button 410. The user may also select the pitch between the probing contacts of the selected probe with the pitch selection window 408. It is also to be understood, that the user may configure the probe station with multiple ports, such as 2, 3, 4, 5, 6, etc. and the same number of ports is reflected on the probe calibration interface. In this manner, the number of probes is consistent between the setup and the probe (e.g., port) selection.

Figure 15:
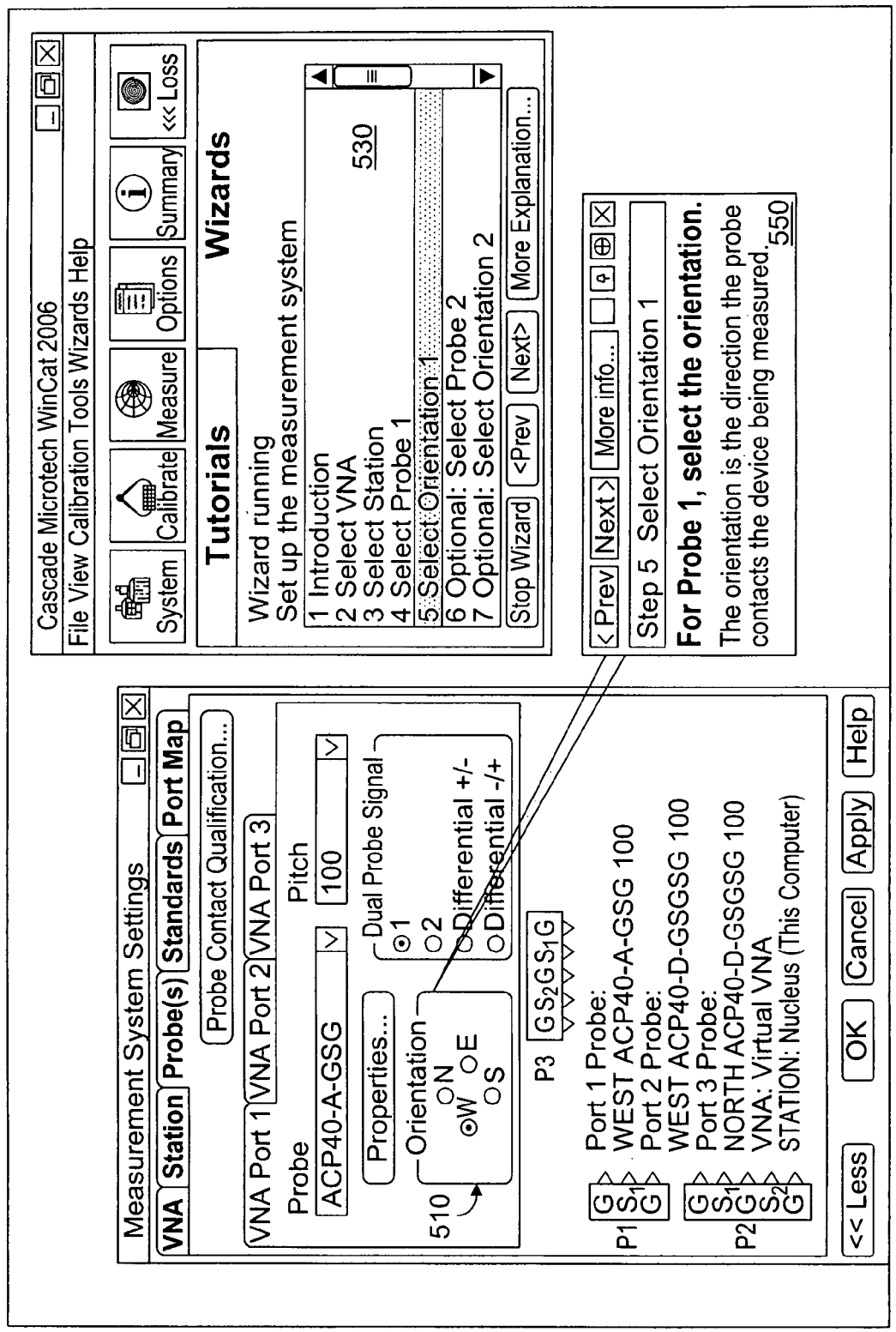
FIG. 15 illustrates a user interface.

Historically, the calibration substrates used in the calibration process are structured such that the probes are assumed to be in an opposing east-west relationship to one another. Correspondingly, the previously existing calibration software likewise presumed this probing alignment and included no notion of probe orientation. It was observed that in some cases the actual probing configuration is different than merely east-west, and that this possibility should be accounted for in the calibration system. The different orientations may affect which substrates are suitable and the desirable structures for the calibration. For example, the probing configuration may be east-west, north-west, north-east, north-south, west-south, east-south, north-north, south-south, west-west, east-east, or otherwise. Further combinations may likewise be used for systems using more than 2 ports. Referring to FIG. 15, after selecting the desired probe, the assistance window 550, the user may select the orientation 510 of the probe associated with port 1, as being N (north), S (south), E (east) or W (west). The selection may be applied.

Figure 16:
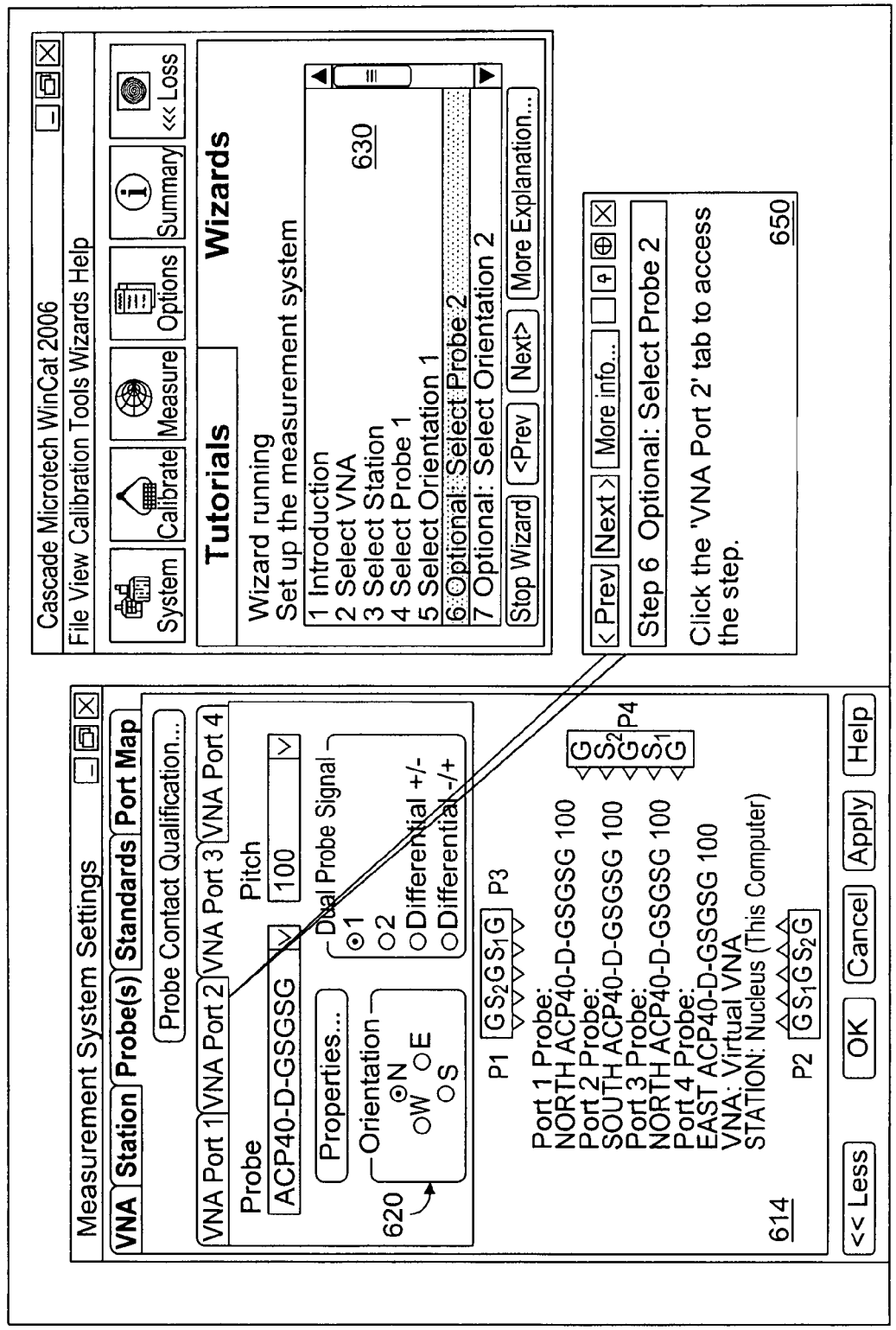
FIG. 16 illustrates a user interface.
Figure 17:
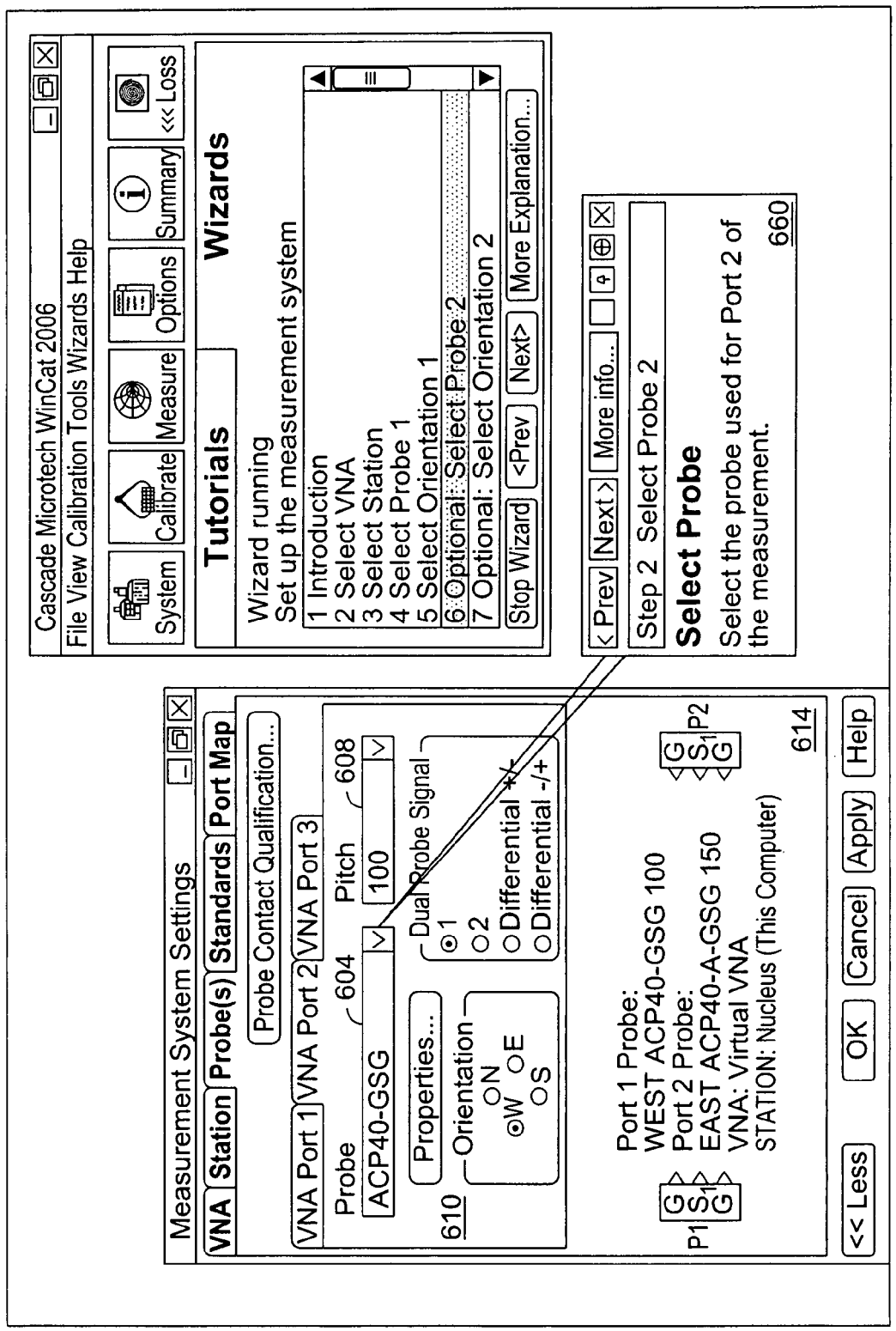
FIG. 17 illustrates a user interface.
Figure 18:
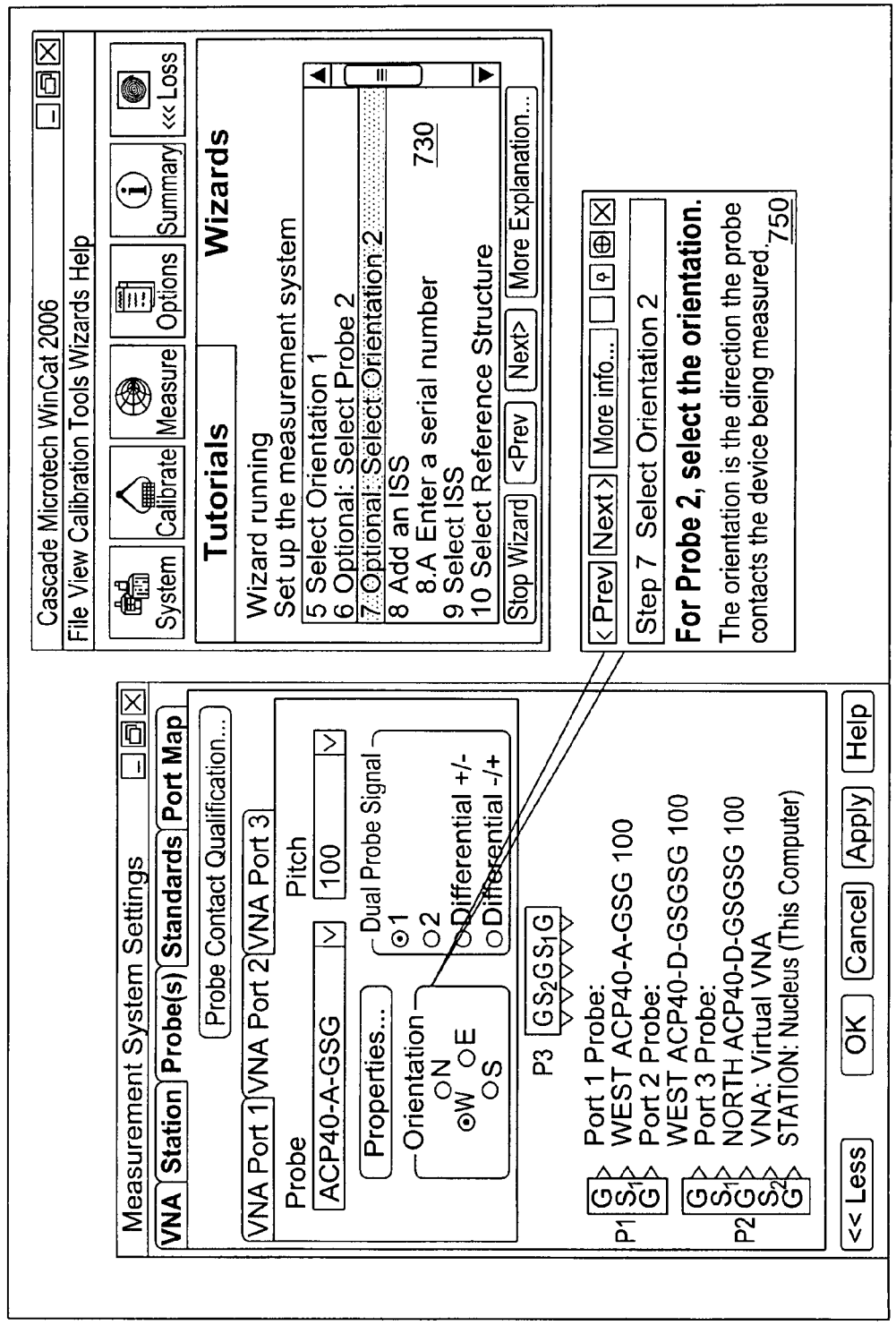
FIG. 18 illustrates a user interface.

After selection of the probe and orientation for the first probe described with reference to FIG. 15, the user may click next on the assistance window 650, move to step 6 in the window 630, or otherwise select the probe for port 2 in the measurement system settings 200 as illustrated in FIG. 16. Referring to FIG. 17, the system then indicates at step 6 in the process within the assistance window 660 to select the probe to be used for port 2. The user then selects a probe from a list of possible probes from the selection window 604 that matches the probe attached to port 2 of the vector network analyzer. The selected probe may have one of several different configurations, such as for example, a signal probe, a ground-signal probe, a ground-signal-ground probe, a ground-signal-ground-signal-ground probe, or a differential probe. After selecting the particular probe within the selection window 604 the system may automatically associate the appropriate measurement characteristics with the particular probe. In many cases, the measurement characteristics of the particular probe are provided by the manufacturer, which are automatically or manually selected by the properties button 610. In other cases, the user may define the measurement characteristics of the probe by the properties button 610. The user may also select the pitch between the probing contacts of the selected probe with the pitch selection window 608. The orientation of the probe on port 2 may be selected in a manner similar to port 1, as illustrated by FIG. 18. A similar process may be repeated for additional probes and/or ports, which may be in excess of four depending upon the system configuration.

Referring again to FIG. 16, a lower region 614 of the window illustrates the selected configuration for the ports. The illustration for each port includes, the probe's configuration, the probe's orientation, pitch, and the probe's type. The probe on port 1 is illustrated as a G-S-G-S-G (ground-signal-ground-signal-ground) type probe with a north orientation. In addition, textual information is included indicating "Port 1 Probe: NORTH ACP40-D-GSGSG 100". For the dual signal probe, the probe selections 620 may be selected to indicate that signal path two is associated with port 1. The probe on port 2 is illustrated as a G-S-G-S-G (ground-signal-ground-signal-ground) type probe with a south orientation. In addition, textual information is included indicating "Port 2 Probe: SOUTH-ACP40-D-GSGSG 100". For the dual signal probe, the probe selections 620 may be selected to indicate signal path one is associated with port 2. The probe on port 3 is illustrated as a G-S-G-S-G (ground-signal-ground-signal-ground) type probe with a north orientation. In addition, textual information is included indicating "Port 3 Probe: NORTH ACP40-D-GSGSG 100". For the dual signal probe, the probe selections 620 may be selected to indicate that signal path one is associated with port 3. The probe on port 4 is illustrated as a G-S-G-S-G (ground-signal-ground-signal-ground) type probe with an east orientation. In addition, textual information is included indicating "Port 4 Probe: EAST ACP40-D-GSGSG 100". For the dual signal probe, the probe selections 620 may be selected to indicate that signal path two is associated with port 4. It may be observed that to further assist the user in the configuration of the software to conform to the actual probing conditions, the probes are illustrated as graphical icons in the lower region 614 with their orientation. In addition, the graphical illustration of each probe provides an indication of the number of signal paths and also provides an indicated of the number of ground paths.

In some cases, it is desirable that the same physical probe be used for multiple ports, such as the north probe being used for both port one on signal path 2 and port three being used on signal path 1. In the case of the same physical probe being used for multiple ports, the system may represent that probe with a single probe. The representation may also include an indication as to which port is associated with which signal path. Also, the window 620 permits a pair of ports to be configured as a differential pair, e.g., +/– or –/+. A large set of ports may be configured in a similar manner. The user may apply the settings. In some cases, it is desirable to include a selection box that permits the illustration of multiple ports on the same probe, or otherwise showing the multiple ports with multiple probes. In this manner, the user has additional control over the interface.

Figure 19:
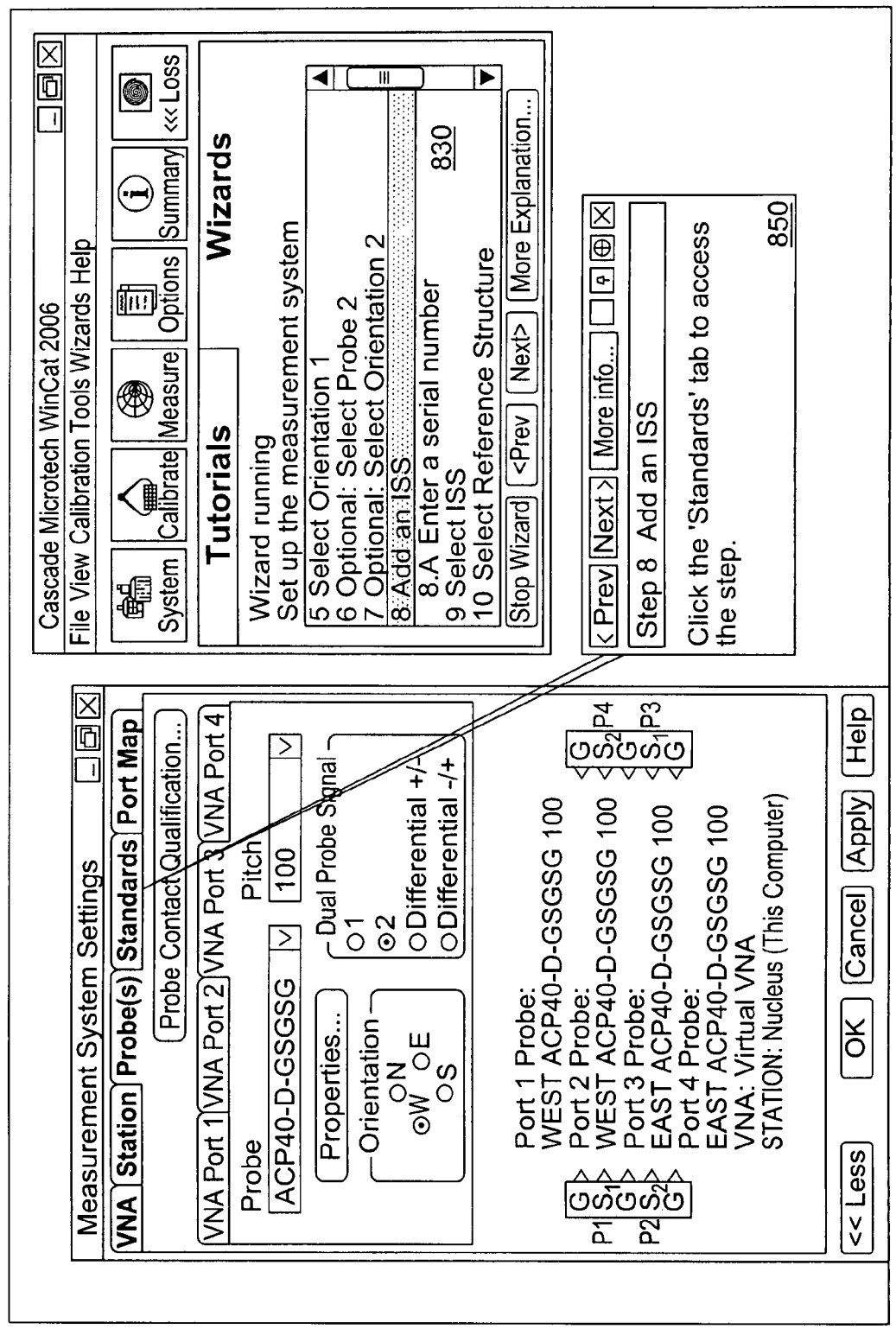
FIG. 19 illustrates a user interface.
Figure 20:
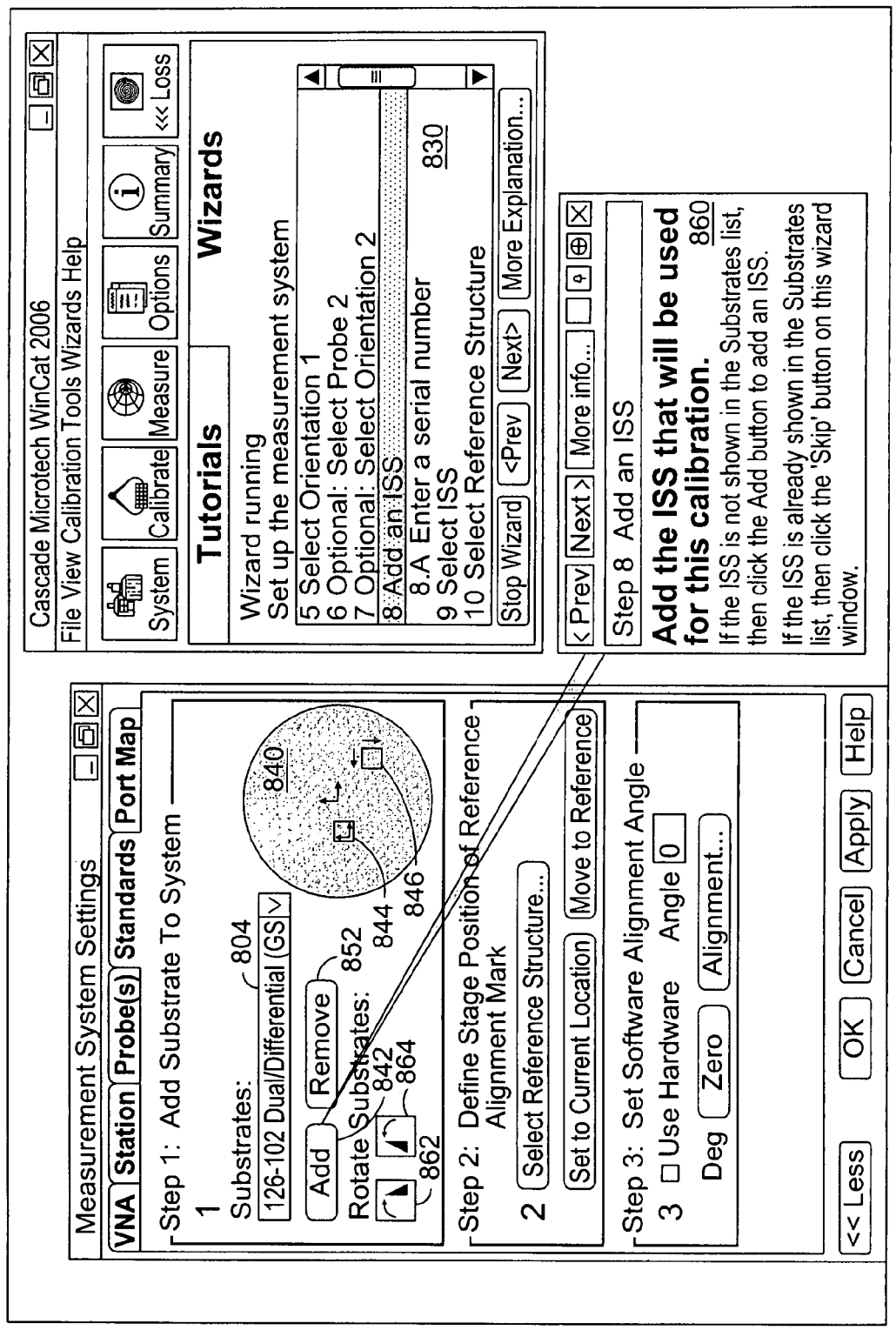
FIG. 20 illustrates a user interface.

After selection of the probes and their orientations, the user may click next on the assistance window 850, move to step 8 in the window 730, or otherwise select the standard in the measurement system settings 200 as illustrated in FIG. 19. Referring to FIG. 20, the system then indicates at step 8 in the assistance window 860 to add an ISS calibration substrate. The ISS standard includes a set of structures thereon which are used for calibration of the probes. In many cases, the calibration structures include open circuit, short circuits, loads, through, and crosses. In most cases, the loads are 50 ohms or another known value. In most cases, the loads have a value within a certain tolerance, such as +/–0.1%.

The user selects a calibration substrate from a list of possible substrates from the selection window 804 that matches the calibration substrate being used. The user may select from many different possible calibration substrates. A simulated region 840 illustrates a support onto which the calibration substrate may be located. By indicating the add button 842 a substrate is positioned on the region 840. The substrate 844 may be moved by the user. In many cases, there are calibration structures on one substrate that are different from calibration structures on other substrates. In the case that multiple calibration structures are desired for a particular type of calibration, then either a single calibration substrate needs to be acquired that has those structures, or multiple calibration structures needs to be obtained that collectively include those calibration structures.

To facilitate more flexible calibration needs, the user may add multiple substrates to the region 840, of the same or different types. In this manner, the user may select from among many different or the same substrates as desired in order to perform the desired calibration of the system. Substrates may be removed with the remove button 852. In many cases, the calibration structures on a particular substrate may not always be in a horizontal orientation, but rather in a vertical orientation and/or horizontal orientation (or other orientation(s)). A rotation selection 862 (clockwise) or rotation selection 864 (counter-clockwise) may be selected to rotate the substrate 90 degrees (or otherwise) in the selected direction. In this manner, each substrate can be aligned for the particular tests to be performed based upon the orientation of the probes and/or the orientation of the calibration structures to be used on the substrates. When using multiple calibration substrates it is particularly useful to be able to orient them in different orientations. The relative graphical location is also typically representative of the location of the substrates on the chuck, such as a calibration chuck. In this manner, the operator can have both a representative view on the display that generally matches the position of the substrates on the chuck. In some cases, the probe station will include a primary chuck upon which the wafer is situated and an auxiliary chuck that is spaced apart from the primary chuck upon which the substrate is located. In this case, the interface may determine that the particular probe station selection includes such an auxiliary chuck and automatically provide an illustration that includes a primary chuck and an auxiliary chuck upon which the substrates are situated. In other cases, the selection of a primary and auxiliary chuck may be user selected.

Figure 21:
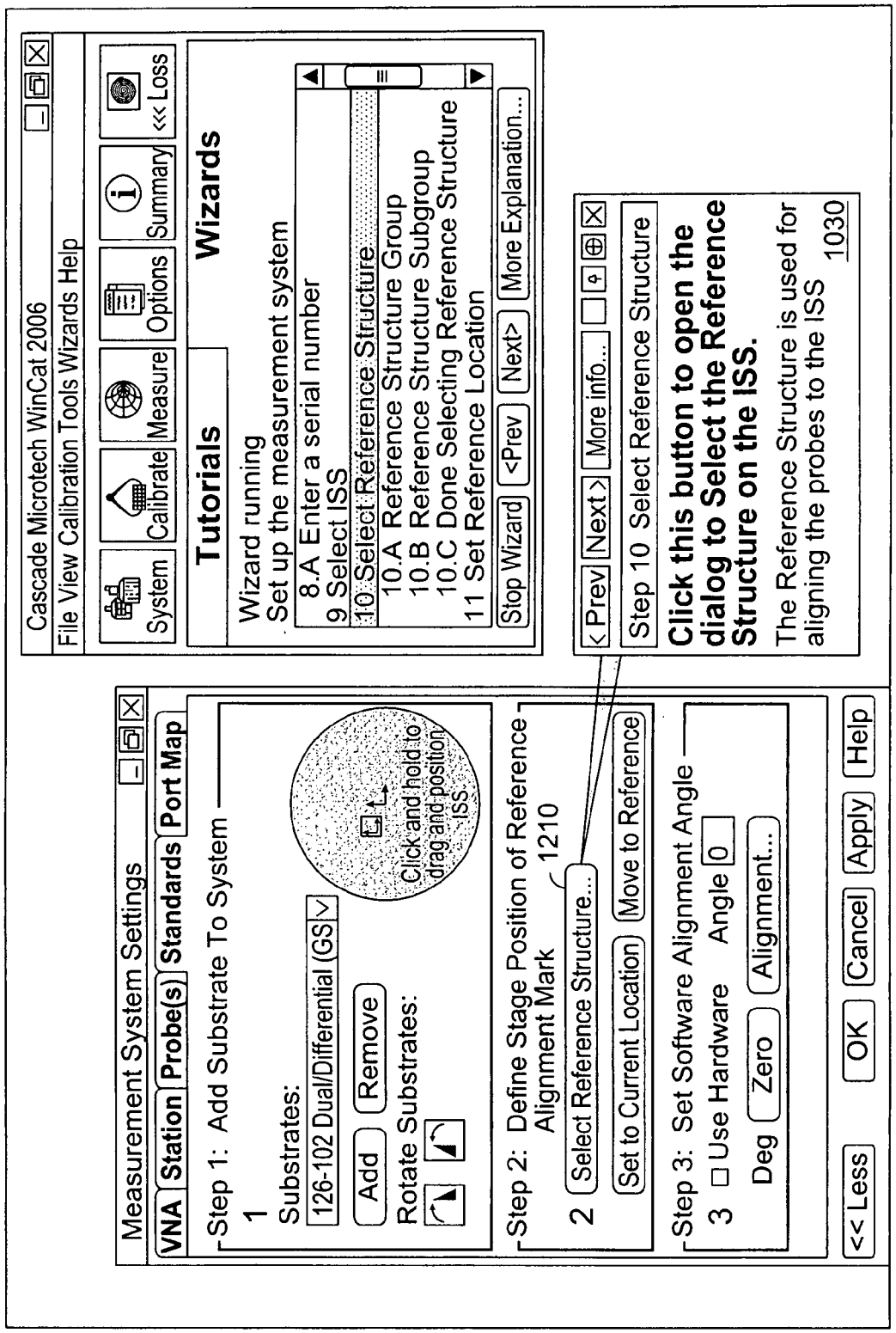
FIG. 21 illustrates a user interface.
Figure 22:
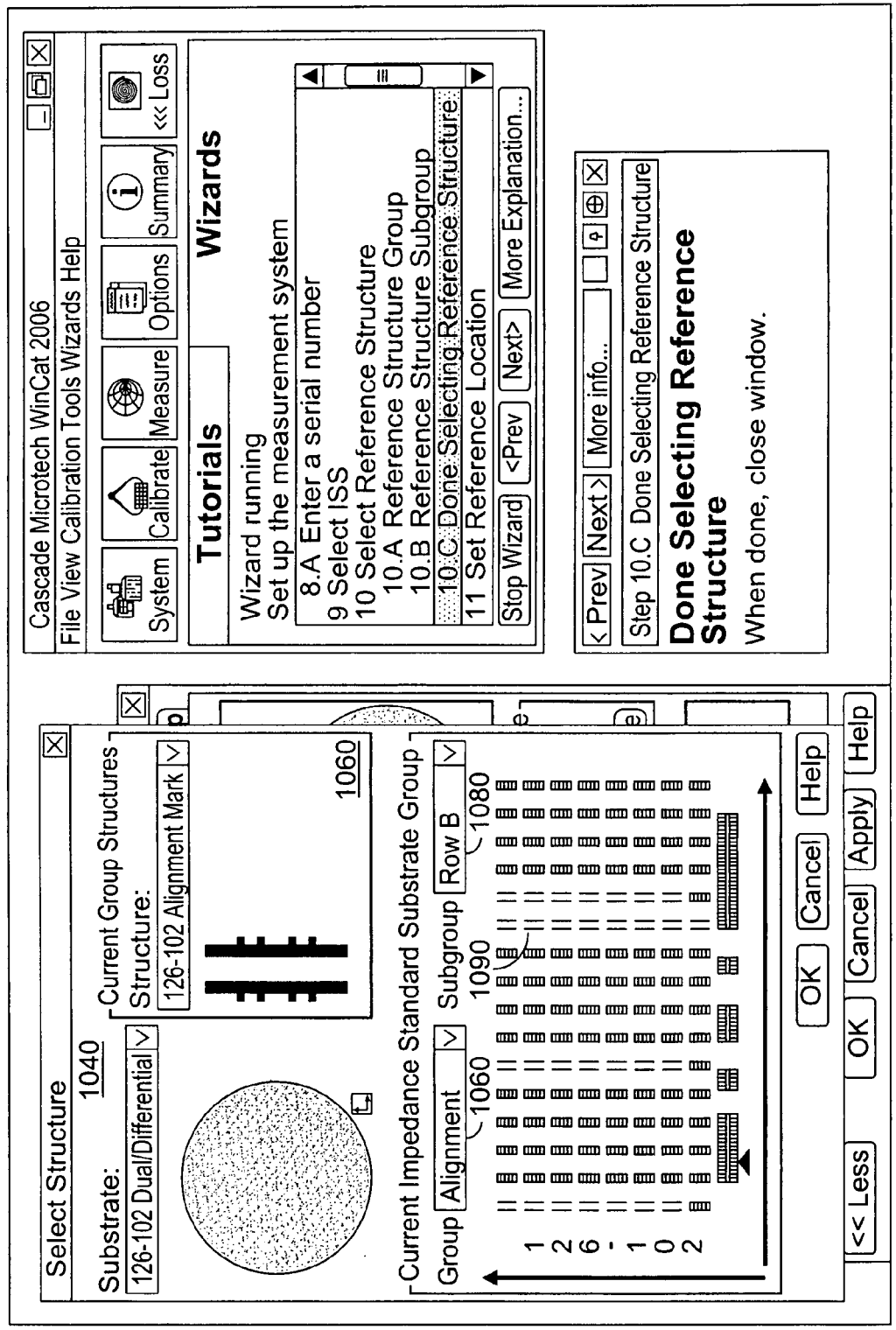
FIG. 22 illustrates a user interface.
Figure 23:
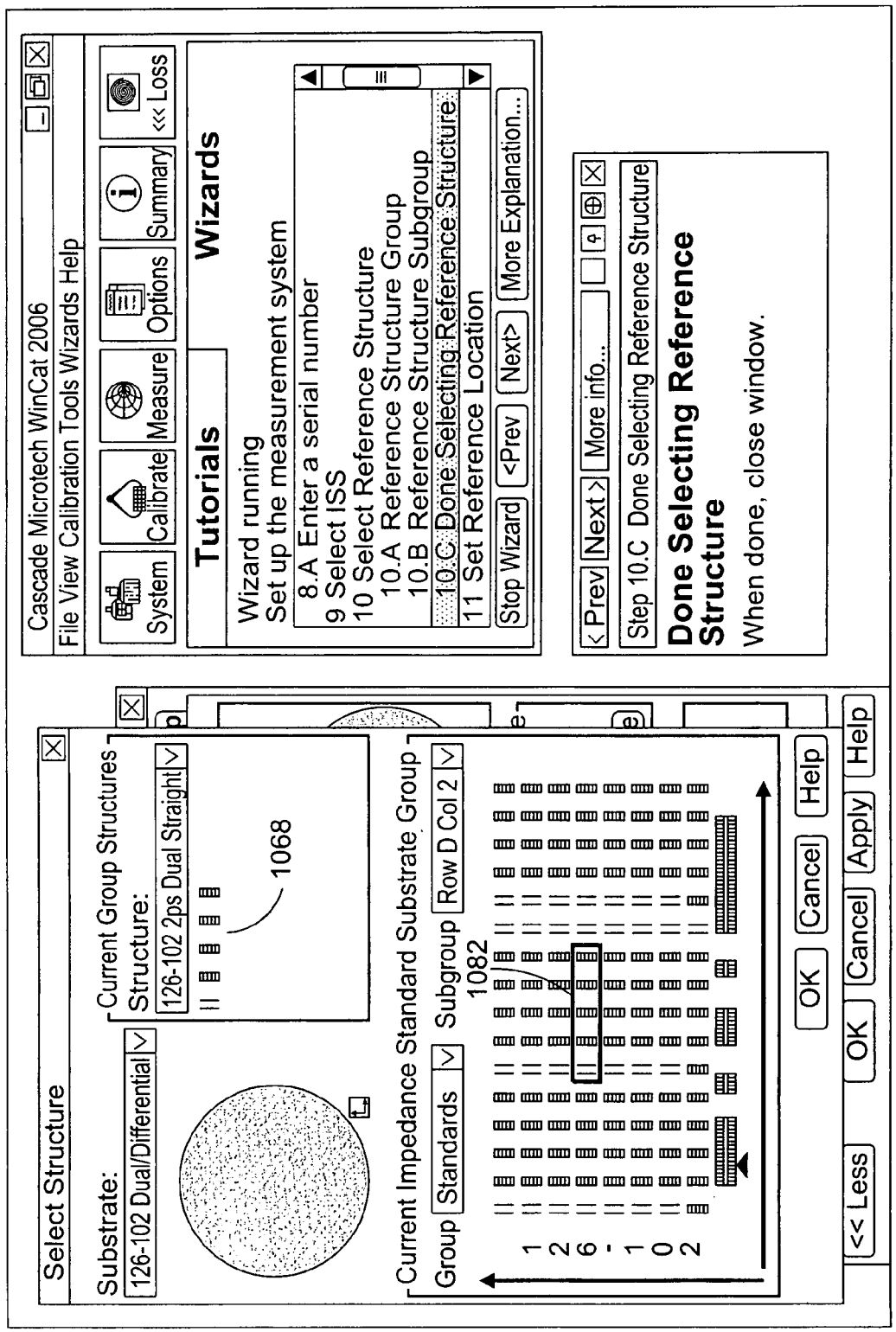
FIG. 23 illustrates a user interface.

After selection of the probes and their orientations, the user may click next on the assistance window 860, move to step 10 in the window 830, or otherwise select the standard in the measurement system settings 200 as illustrated in FIG. 20. Referring to FIG. 21, the system then indicates at step 10 in the assistance window 1030 that the user should select the reference structure(s) 1210 on the actual substrate to be used. Referring to FIG. 22, upon selection of the reference structure 1020 a window 1040 is provided where the user may select a reference structure group 1060, such as an alignment mark. In addition, the user may select which subgroup 1080 of the alignment structure. For example, the user may select an alignment mark 1090 in row B (second row). This indicates where the probe is aligned to, which is performed by the user with a microscope or otherwise by automatic alignment mechanisms. Referring to FIG. 23, the group may be a standard which refers to those structures used for a particular standard. The standard grouped in FIG. 23 is a group of 5 structures 1082 at Row D, Column 2 that includes a short, open load, through, and straight. In addition, a plurality of different non-adjacent structures may be selected on the substrate to achieve the desired test. This is particularly useful when portions of a particular calibration group on the calibration substrate wears out after repeated use. Thus the other structures within the group may continue to be used. Illustrations 1068 illustrate the type of reference structure that is selected. It is understood that the user may align the probes to any structure or portion of the substrate and based upon this structure, the system may automatically move from structure to structure, even if the structures are not aligned but rather scattered across the substrate. Hence, the alignment need not be to a particular row or device of the substrate.

Figure 24:
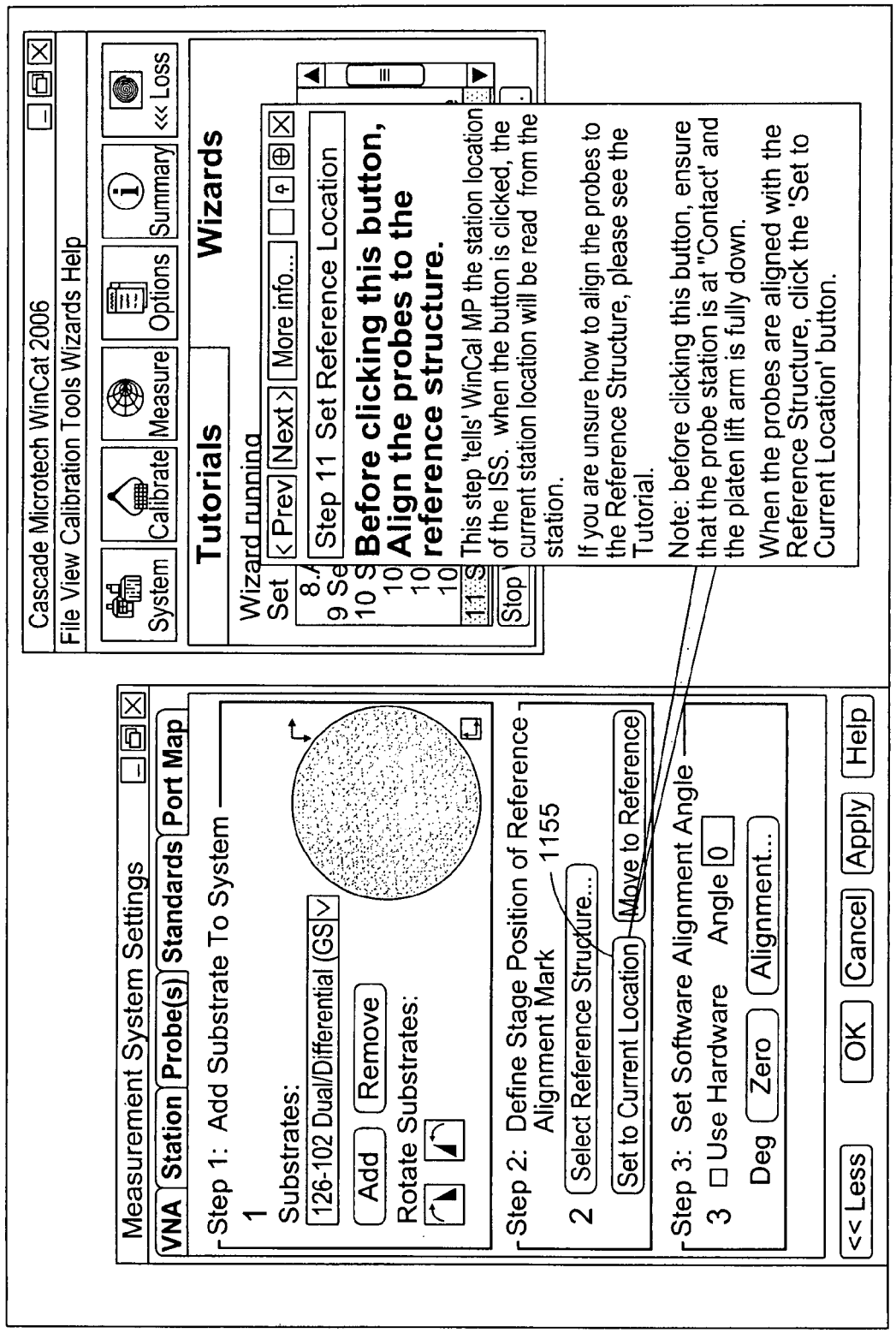
FIG. 24 illustrates a user interface.

After selecting the desired structure on the substrate upon which to perform the calibration test at step 11, it is desirable to select an appropriate reference location as illustrated in FIG. 24. The user should position the probes on the desired location of the substrate, such as on an alignment mark or other calibration structure. Then the user should set the probe to current location with button 1155. In this manner, the system has now associated the desired substrate and a location on the desired substrate with the actual probing system.

Figure 25:
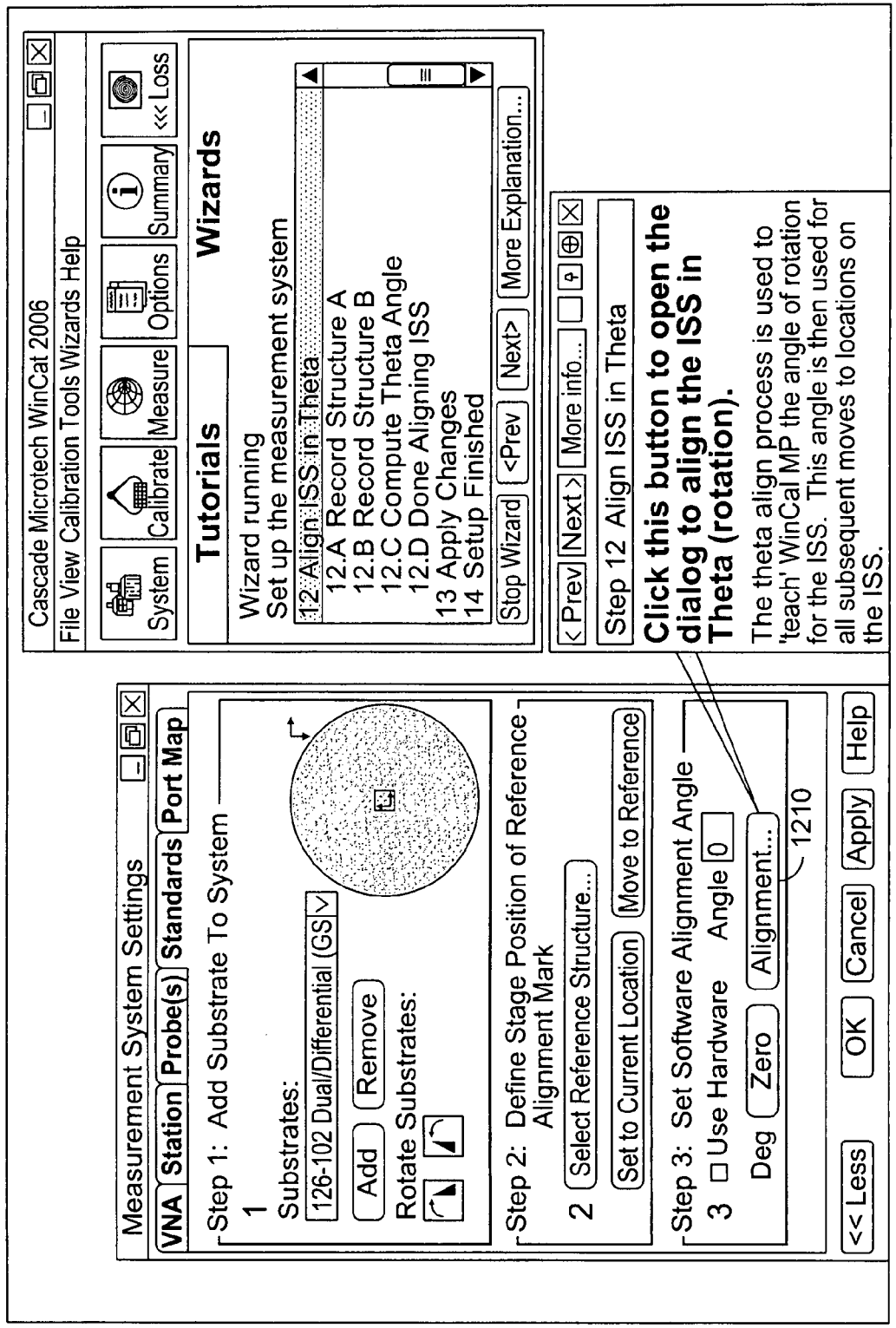
FIG. 25 illustrates a user interface.
Figure 26:
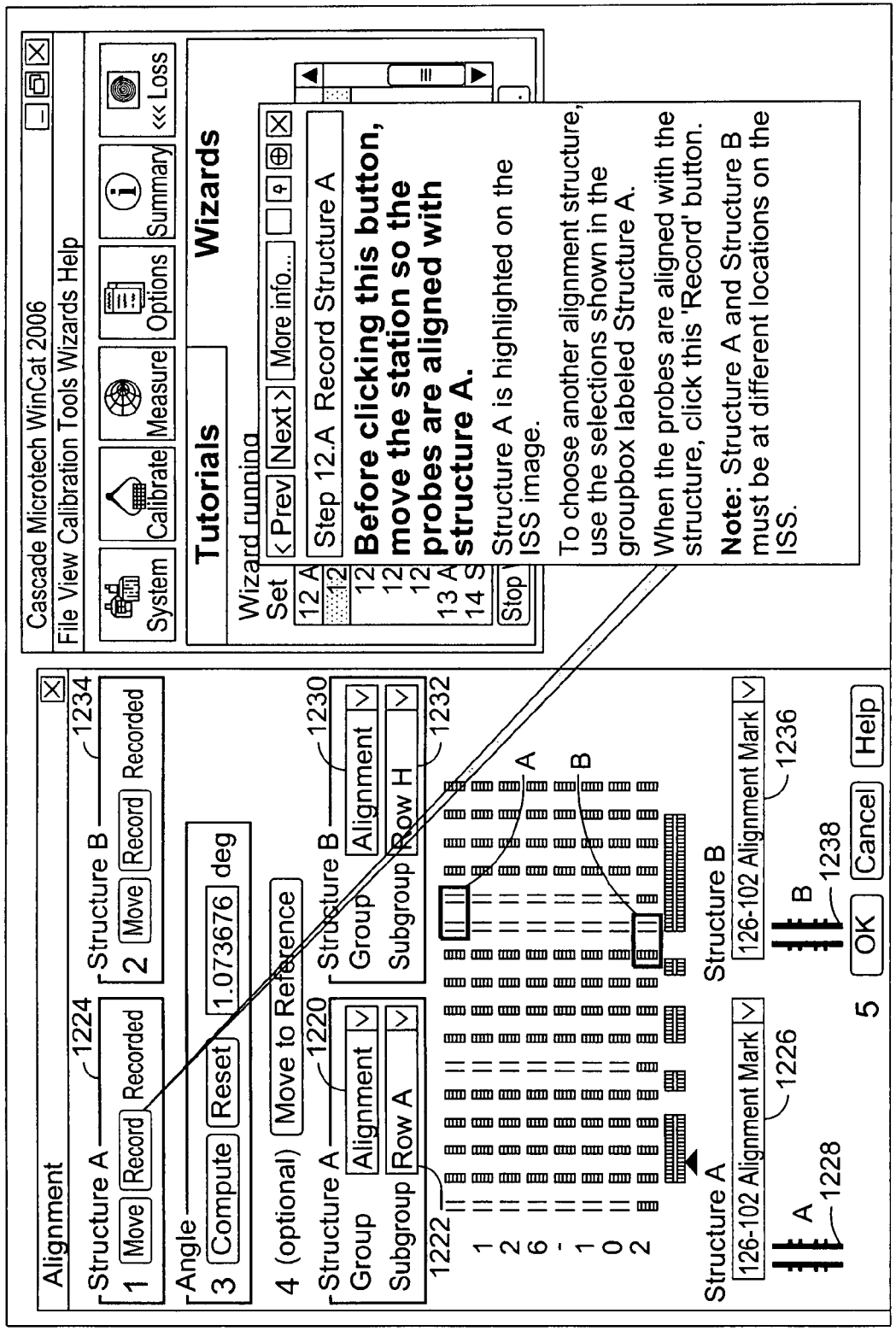
FIG. 26 illustrates a user interface.
Figure 27:
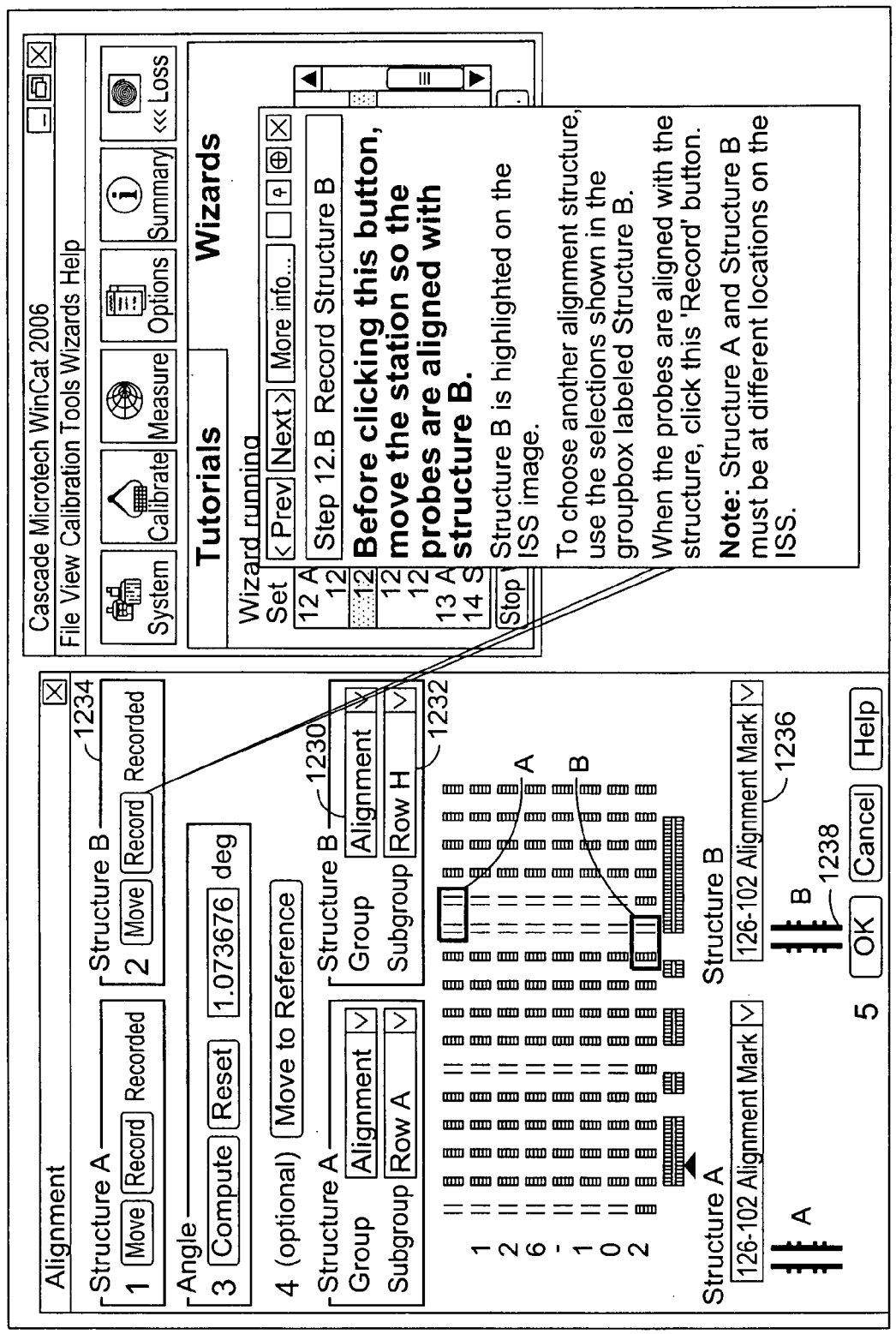
FIG. 27 illustrates a user interface.

Referring to FIG. 25, the user then uses the alignment mechanism to adjust the theta alignment of the substrate with respect to the x-y-z movement of the stage and/or x-y-z movement of the probes. The user selects the alignment mechanism 1210 which opens an alignment mechanism illustrated in FIG. 26. The user then may select a first group 1220, and a subgroup 1222 which is identified as group "A". The user then may align the probe to this reference structure using the move function then click record 1224 to identify the location. Referring also to FIG. 27, the user then selects a second group 1230, and a subgroup 1232 which is identified as group "B".

Figure 28:
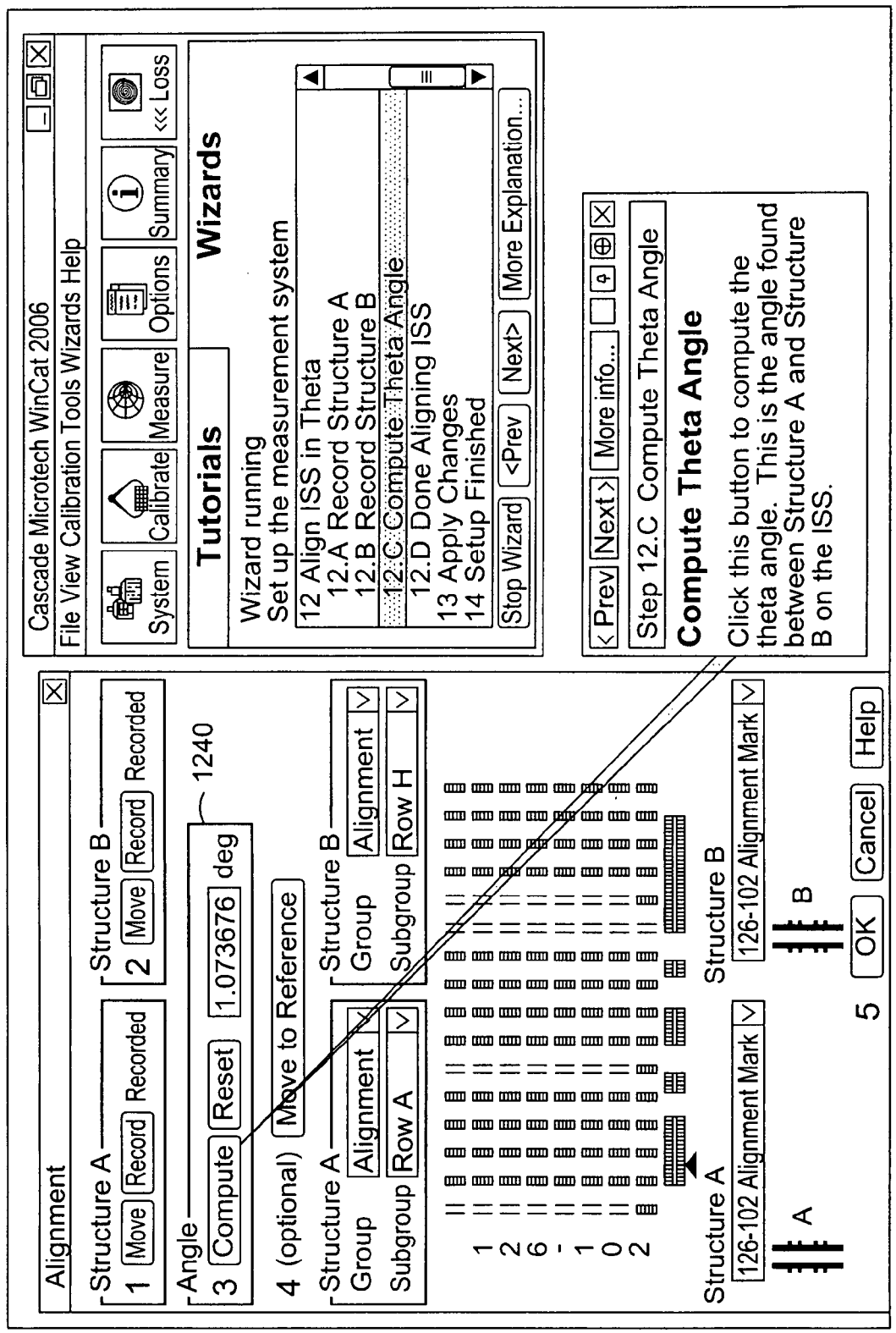
FIG. 28 illustrates a user interface.
Figure 29:
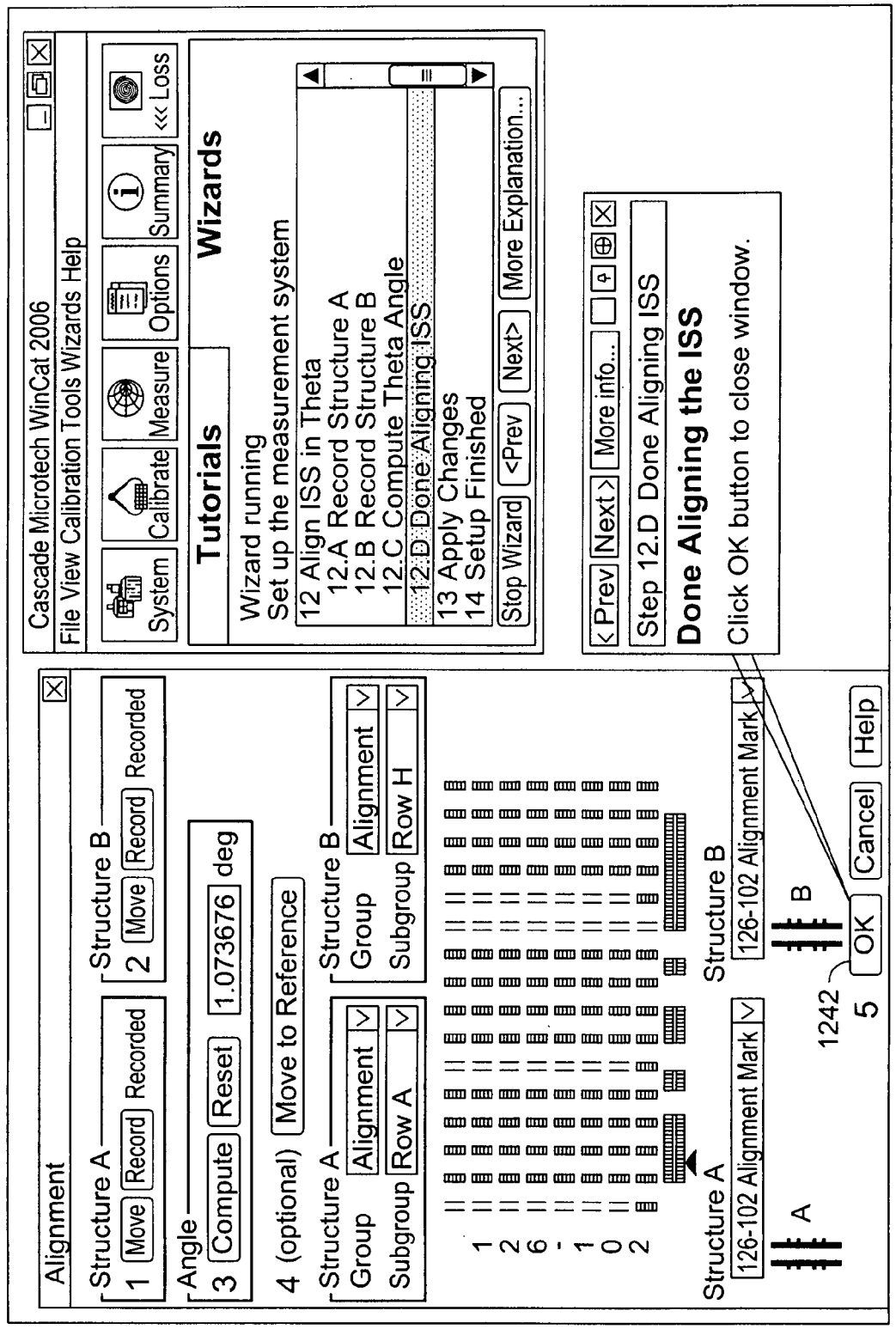
FIG. 29 illustrates a user interface.

The user may align the probe to this reference structure using the move button then click record 1234 to identify the location. The type of structure A is identified at 1226 together with a graphical illustration of that structure 1228. The type of structure B is identified at 1236 together with a graphical illustration of that structure 1238. Referring to FIG. 28, the user may then compute the theta angle between reference structure A and reference structure B on the substrate by clicking button 1240. In this manner, the user may get the orientation and spacing for proper future positioning of the probes on the calibration substrate. The system may use the alignment structure as the base reference, if desired. Referring to FIG. 29, when completed, the user may select the "OK" button 1242 to accept and close the window. In this manner, the user is not required to provide accurate orthogonal alignment of the substrate with respect to the stage movement.

Figure 30:
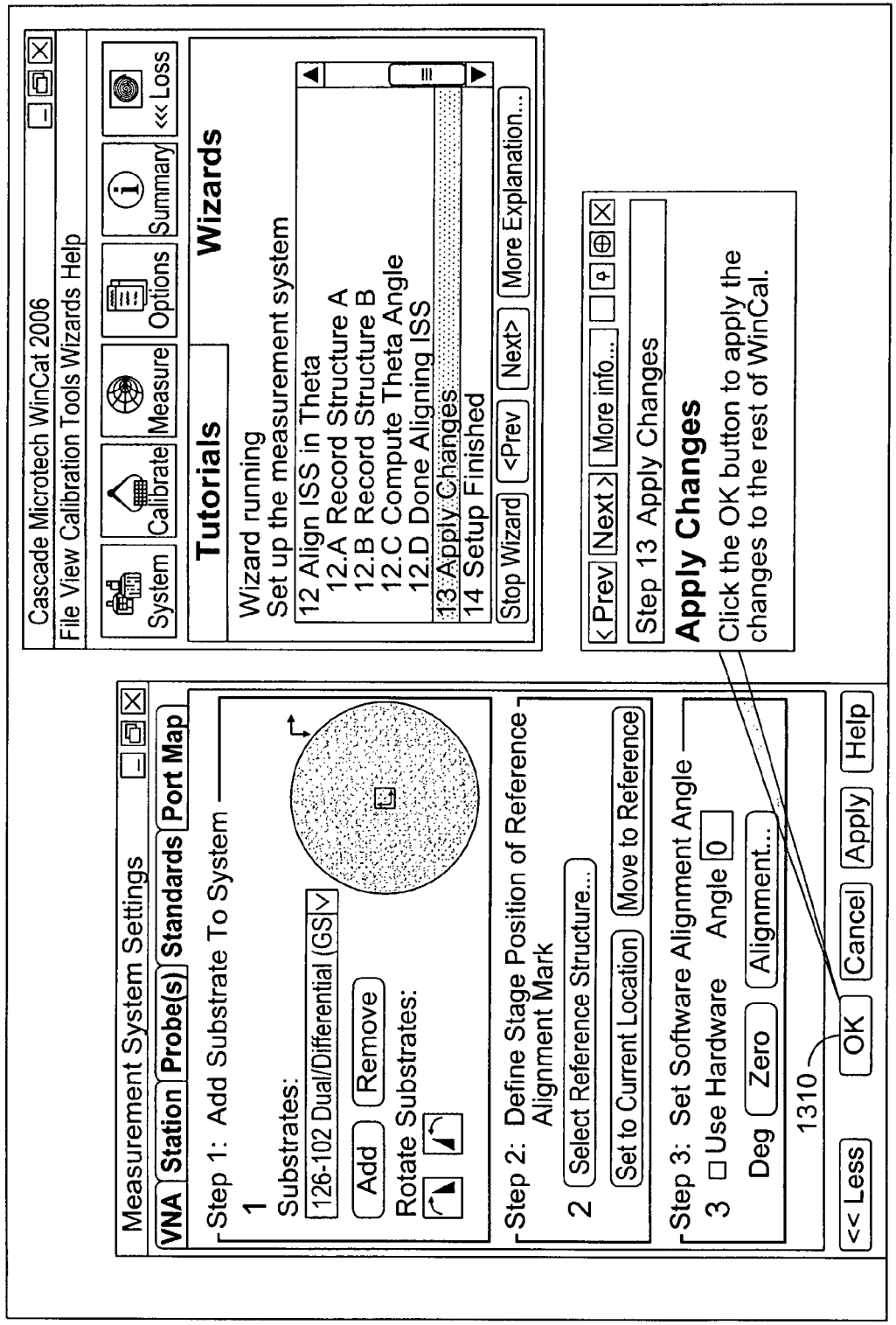
FIG. 30 illustrates a user interface.
Figure 31:
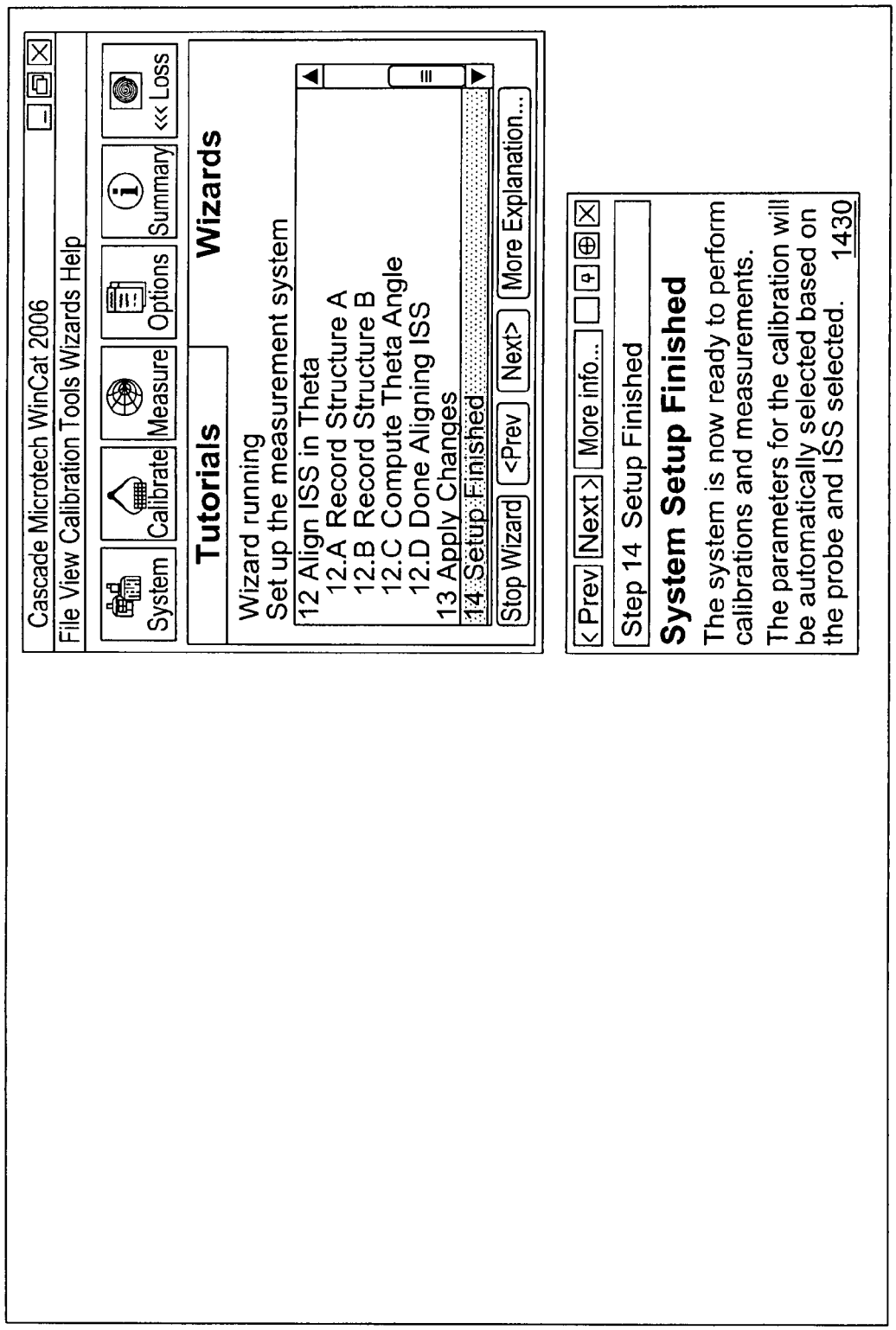
FIG. 31 illustrates a user interface.

Referring to FIG. 30, when these selections are made, the user may apply the changes using the "OK" button 1310. Referring to FIG. 31, the user has completed the setup and is notified of this event in the assistance window 1430.

The system may likewise include a wizard editor for the calibration system.

Figure 32:
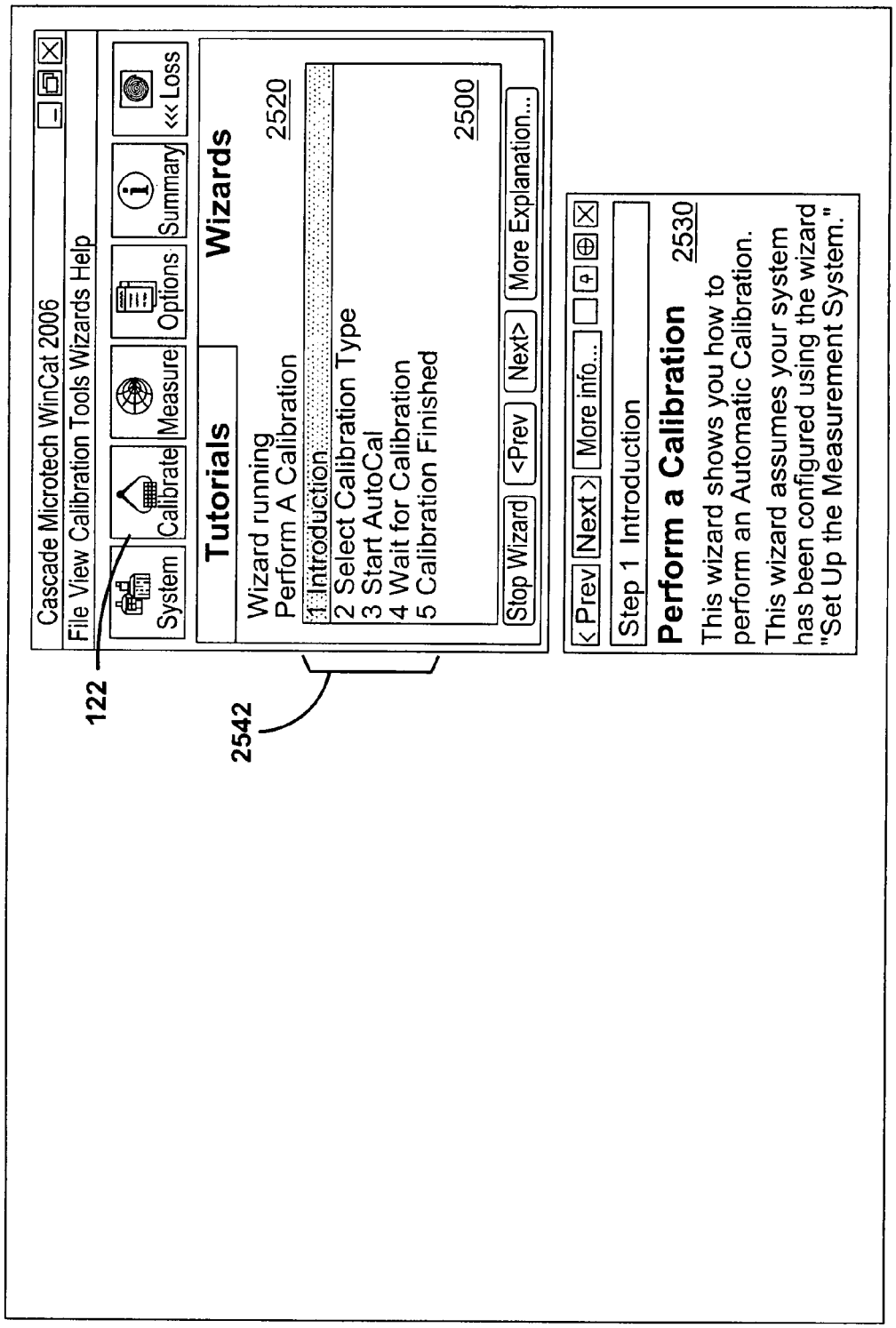
FIG. 32 illustrates a user interface.

Referring to FIG. 32, the system may include a wizard to perform the actual calibration includes a first window 2500 which displays a selection of the principal tasks for performing a calibration. A window 2520 indicates that the wizard is being used and the steps 2542 that the user is guided through by the wizard. The wizard provides an assistance window 2530 that includes further information regarding the particular step that is being performed by the user. The description in the assistance window 2530 corresponds to the particular item being highlighted by the wizard.

Figure 33:
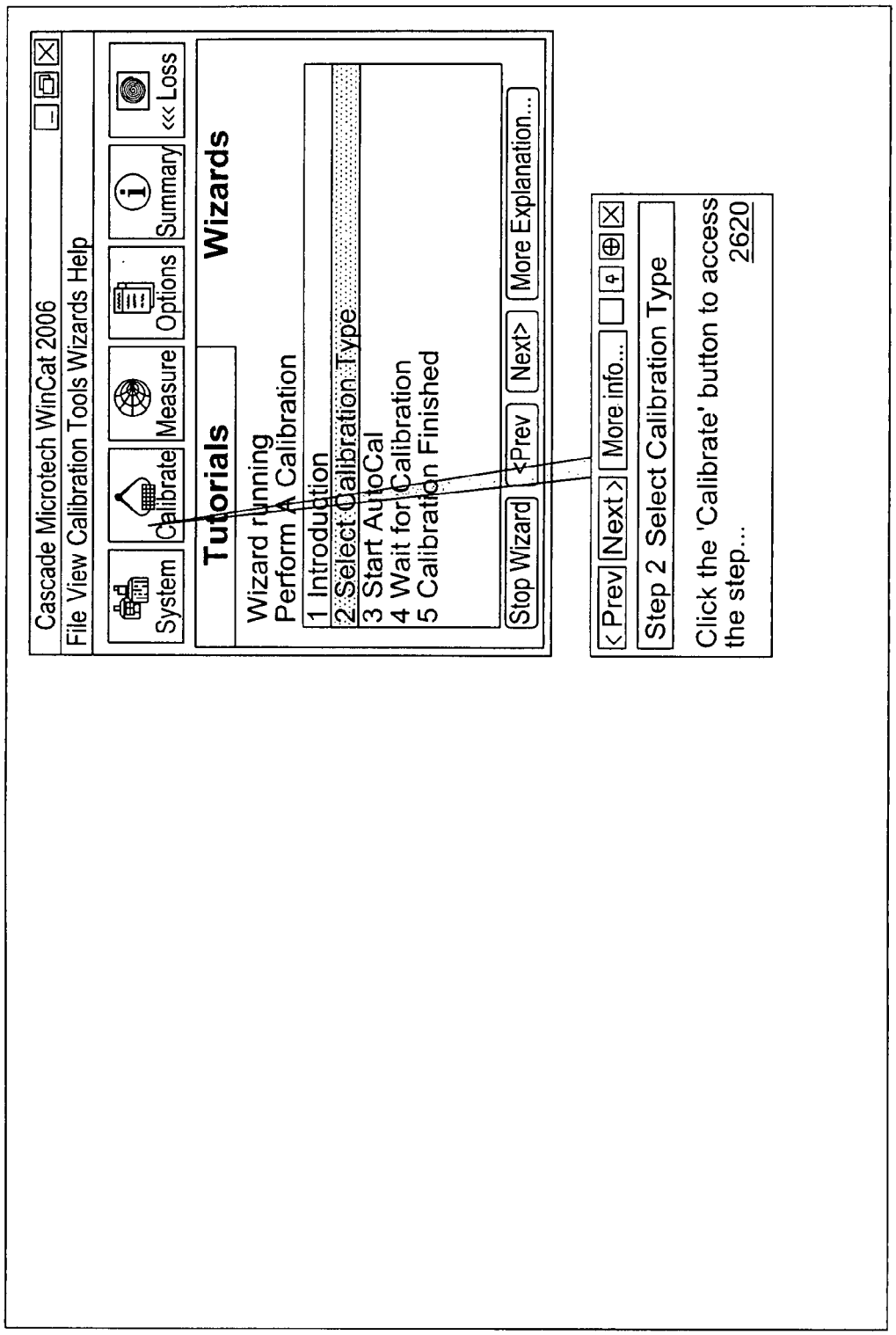
FIG. 33 illustrates a user interface.
Figure 34:
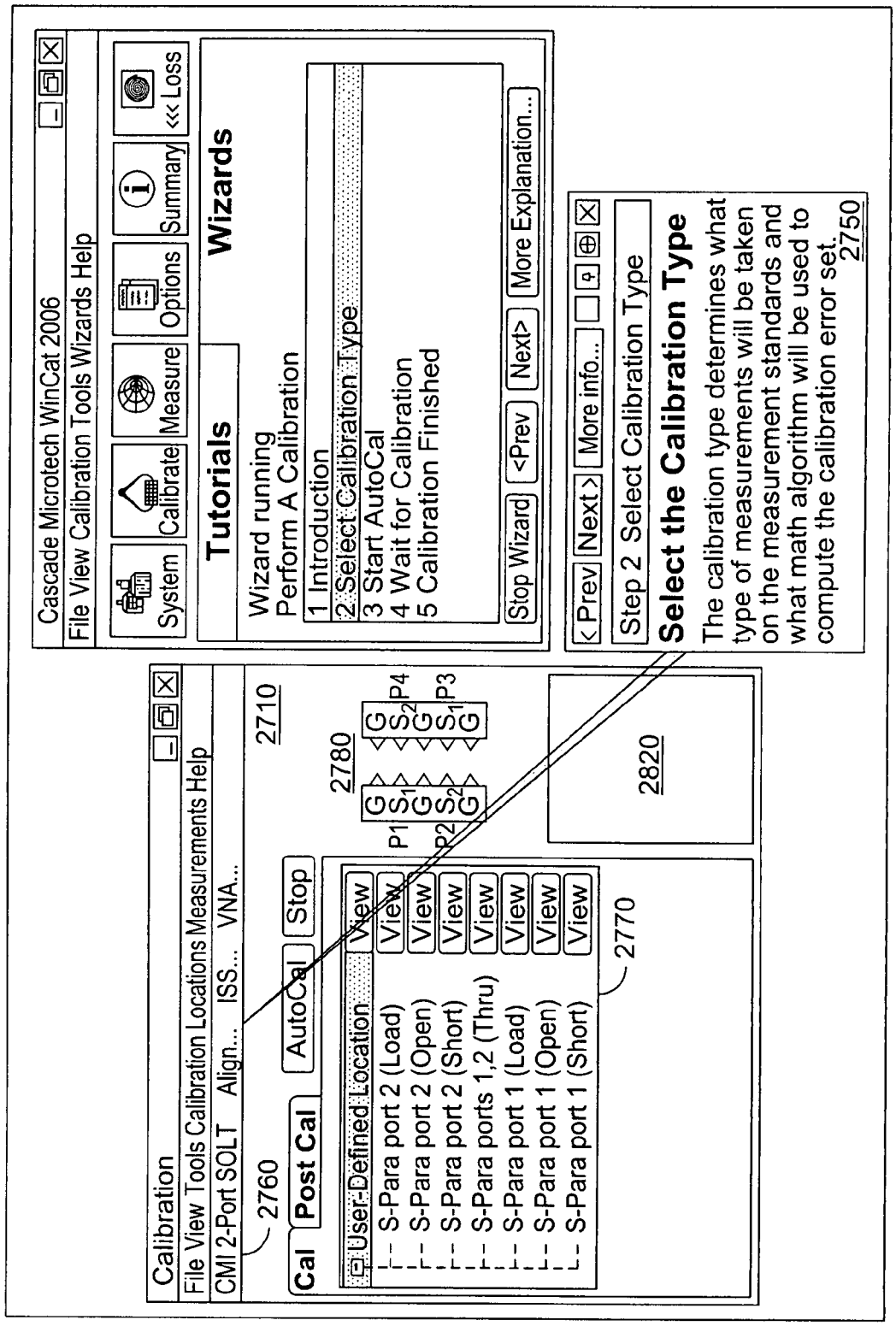
FIG. 34 illustrates a user interface.

The assistance window 2530 preferably includes textual information that further guides the user through the calibration process. To calibrate, as indicated by the assistance window 2530, the user may select the 'calibrate' button 122, move to step 2 in the window 2500, or otherwise click next in the assistance window 2530. Referring to FIG. 33, the second step of the calibration process includes selecting the calibration type as illustrated in the assistance window 2620. Referring to FIG. 34, upon selection of the calibration type, a window 2710 opens. An assistance window 2750 indicates that the calibration type 2760 determines what type of measurements will be taken on the measurement standards and what technique will be used to compute the calibration error set. The user may select from among several different types of measurements.

The window 2770 shows a 'plan' for performing a 2-Port SOLT test. For example, the test may include testing port 2 for load, port 2 for open, port 2 for short, ports 1 and 2 for through, port 1 for load, port 1 for open, and port 1 for short. By illustrating a test-by-test plan for performing the selected calibration the user may step through the calibration process if performed manually. I this manner, the user will perform the calibration tests in the proper order in order to determine the calibration coefficients.

In some cases, the "autocal" button 2780 may be selected. The system then may automatically reposition the probes on the appropriate structures on the calibration substrate in an appropriate order to perform the test. The tests may be performed on a continuous set of calibration structures if desired. Also, the tests may be performed on a non-continuous set of calibration structures if desired. The system may permit the user to identify those structures that are not suitable for testing or otherwise worn from use, and thus not use those calibration structures.

Figure 35:
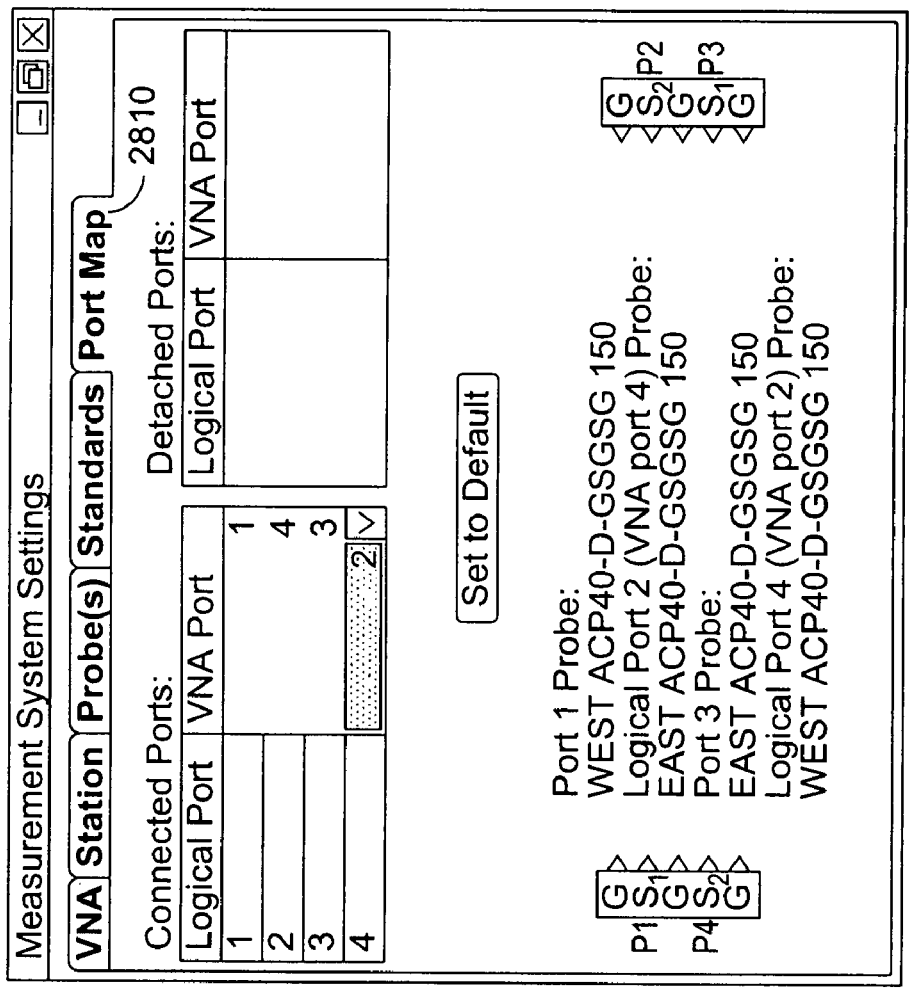
FIG. 35 illustrates a user interface.
Figure 36:
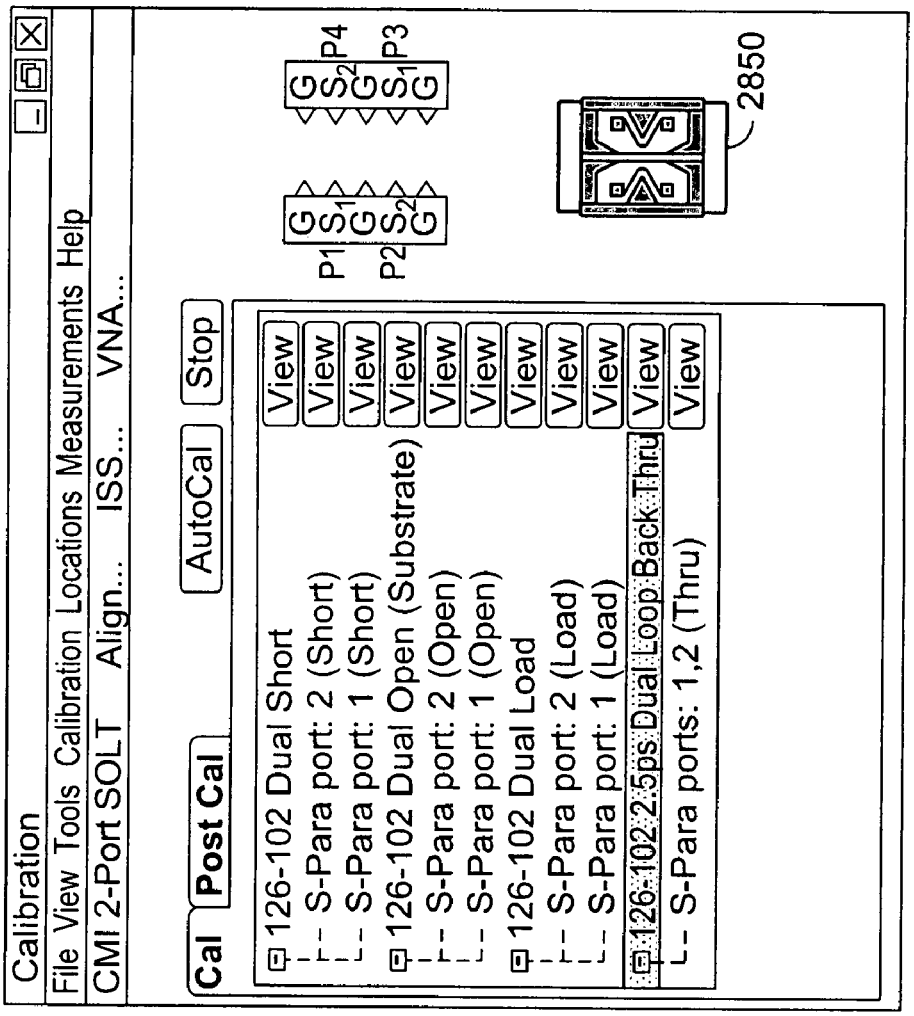
FIG. 36 illustrates a user interface.

The window region 2780 illustrates the logical layout of the probing configuration which is straightforward to follow. The logical layout is typically an indication of which port is connected to which probe. Referring to FIG. 35, a port map 2810 indicates a mapping between the logical ports connected to the probe(s) and the actual physical port of the VNA. In this manner there is a mapping between the probes and the physical connection at the VNA.

In some cases the actual physical layout of the probes is different than that illustrated in the graphic region. In this case, the actual test to be performed to achieve the necessary calibration may vary from what would otherwise appear to be the test. To assist the user, if manually selected calibrations, the window 2820 may display a representative graphic of the calibration structure to be used. For example, the graphic may be a look-back, through, diagonal, short, open, etc.

The list of the tests may likewise be shown together with the appropriate structure to perform that test based upon the logical port and VNA port mapping. In addition, the appropriate test may be based upon the physical probes, the structures on the particular substrate, and/or the orientation of the substrate. When the tests are being performed, the graphical illustration may change to illustrate which structure is being used for the particular step of the test. In this manner, the user may track the testing progress.

When the calibration process is completed, the system preferably provides the calibration parameters to the VNA. In addition, the data may be viewed in a reporting system.

While the system, if properly operated, tends to provide accurate calibration parameters. There are other factors that may influence the ability to obtain quality calibration parameters. For example, the cabling between the vector network analyzer and the probes may be faulty or is not suitably connected at its terminals. In other cases, improper cabling may be used, which is difficult to determine as being improper unless the operator carefully checks the specifications of the cabling. In some cases, the probe itself will be faulty to a greater or lesser degree, in which case the calibration parameters will not be proper. During a calibration process the operator, or the system, needs to make proper contact with minimal contact resistance between the probes and the calibration structures on the substrate. A poor contact with excess contact resistance results in inaccurate calibration parameters. In some cases, the operator will position the probe tips slightly off the contact pads on the device under test, which tends to result in inaccurate calibration parameters. At times the actual vector network analyzer itself is faulty or the settings of the vector network analyzer are improper for calibration, once again resulting in inaccurate calibration parameters. In many cases, the particular calibration substrate includes loads for which a selected set are 'trimmed' to within a suitable tolerance level. The remaining loads are typically not 'trimmed' to within the tolerance levels, and hence remain untrimmed. The 'trimming' of the loads merely refers to modifying the value of the resistance of a load which may be performed in any manner, such as for example, physical trimming, heating, stretching, or otherwise.

After considering all of the potential pitfalls of obtaining an accurate calibration for subsequent probing it was determined that the setup of the calibration system provides sufficient data from which to generally determine what the calibration parameters should be. The system includes a description of the calibration substrate being used, and the characteristics of the calibration structures. In many cases the characteristics are either 'fully known' or 'partially known'. In this manner, the system is generally aware of what the characteristics of the calibration substrate structures should be.

The system may also know the general characteristics of the cables, which tend to be stable over reasonable periods of time. Also, the system may also know the general characteristics of the vector network analyzer which also tends to be stable over reasonable periods of time. Moreover, the system may be aware of the characteristics of the vector network analyzer with particular settings being selected, such as for example, the attenuation, the frequency range, and the power levels. In addition, the probes are also "known" with parameters being provided by the manufacturer or provided by the operator to the system. In many cases, these 'known' characteristics are the result of default values, values provided by the system, values calculated by the system, or otherwise inferred or measured from previous calibrations of the system (same or different configuration).

Based upon the estimated characteristics of the system, such as being a function of the calibration substrate, the cables, the vector network analyzer, the settings of the vector network analyzer, and/or the probe, the system may calculate an estimation of the system error terms. The estimated system error terms, while in many cases not precisely accurate, will tend to provide an indication of the anticipated error terms as a result of calibration.

To simplify the determination of these parameters, the operator may perform a reference coaxial calibration. This calibration tends to take into account the vector network analyzer together with the cables. Based upon this reference coaxial calibration or the parameters determined from such a reference coaxial calibration, the system may then incorporate an estimation of the probe characteristics (e.g., a delay or S-parameters. This combination may provide a set of estimated system error terms, while in many cases not precisely accurate, will tend to provide an indication of the anticipated error terms as a result of calibration.

Another technique is to obtain the estimated system error terms and then obtain a set of actual measurements. Based upon the actual measurements an estimate of the characteristics of the calibration substrate may be determined. Then the calibration for the estimated substrate may be compared against the anticipated characteristics of the substrate. Based upon these comparisons, a determination may be made if the calibration is likely a good one.

The system may likewise monitor the calibration characteristics of the system over time during different calibrations. In this manner, the system keeps updating its measured calibration coefficients rather than having a merely static configuration. The updated characteristics are of assistance in attempting to determine whether the current calibration is a good calibration.

With the estimated system error terms and knowledge of the particular calibration substrate, such as its characteristics, the system can determine what calibration the calibration parameters should generally be or otherwise what the characteristics of the calibration parameters should appear like. This may be compared against the actual calibration parameters determined from the calibration. If the two calibration sets are sufficiently similar then the system may indicate that a good calibration was performed, if the two sets are insufficiently similar then the system may indicate that the calibration is suspect.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

The invention claimed is:

1. A method of calibrating a port of a vector network analyzer comprising the steps of:
    (a) determining a magnitude of an expected reflection for a reference open standard;
    (b) estimating a plurality of load inductance values for a load;
    (c) calculating a magnitude of an estimated reflection for each of said plurality of estimated load inductance values;
    (d) determining a difference between said magnitude of said expected reflection for said reference open standard and said magnitude of said estimated reflection for each of said estimated load inductance values; and
    (e) selecting one estimated load inductance value that minimizes a sum of said difference between said magnitude of said expected reflection for said reference open standard and said magnitude of said estimated reflection for said estimated load inductance for a plurality of frequencies; and
    (f) calibrating a port of said vector network analyzer to correct a measurement at said port for an effect of said one estimated load inductance value.

2. The method of claim 1 wherein said method accounts for differences between the load measured at a probe-tip reference plane and measured at a center-of-thru reference plane.

3. The method of claim 1 wherein each of said plurality of estimated load inductance values comprises a reactance of said load.

4. The method of claim 1 wherein for each of said estimated load inductance values a load impedance at a probe tip is computed.

5. The method of claim 4 wherein each computed load impedance at said probe tip is translated to a thru-center reference plane.

6. The method of claim 5 wherein at least one error term is renormalized based upon said translated computed load impedance.

* * * * *